US007800393B2

(12) United States Patent  
Ito et al.

(10) Patent No.: US 7,800,393 B2  
(45) Date of Patent: Sep. 21, 2010

(54) ELECTRONIC DEVICE TEST APPARATUS FOR SUCCESSIVELY TESTING ELECTRONIC DEVICES

(75) Inventors: Akihiko Ito, Tokyo (JP); Kazuyuki Yamashita, Tokyo (JP); Yoshihito Kobayashi, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 12/566,265

(22) Filed: Sep. 24, 2009

(65) Prior Publication Data

US 2010/0148793 A1 Jun. 17, 2010

Related U.S. Application Data

(63) Continuation of application No. 11/571,428, filed as application No. PCT/JP2005/013590 on Jul. 25, 2005, now Pat. No. 7,612,575.

(30) Foreign Application Priority Data

Jul. 23, 2004 (JP) .............................. 2004-215802

(51) Int. Cl.  
*G01R 31/26* (2006.01)

(52) U.S. Cl. ..................................... 324/765; 324/158.1

(58) Field of Classification Search .............. 324/158.1, 324/753, 760–765; 414/403, 416, 590; 714/738  
See application file for complete search history.

(56) References Cited

U.S. PATENT DOCUMENTS

| 5,313,156 | A | | 5/1994 | Klug et al. | |
|---|---|---|---|---|---|
| 5,589,953 | A | * | 12/1996 | Tazawa et al. | ............... 358/498 |
| 6,078,188 | A | | 6/2000 | Bannai et al. | |
| 6,314,332 | B1 | | 11/2001 | Kida | |
| 6,518,745 | B2 | | 2/2003 | Kim et al. | |

(Continued)

FOREIGN PATENT DOCUMENTS

JP 11-023659 1/1999

(Continued)

OTHER PUBLICATIONS

English language Abstract of JP 11-023659, Jan. 29, 1999.

(Continued)

*Primary Examiner*—Minh N Tang  
*Assistant Examiner*—Trung Q Nguyen  
(74) *Attorney, Agent, or Firm*—Greenblum & Bernstein P.L.C.

(57) ABSTRACT

An electronic device test apparatus includes a plurality of testers on which are mounted test heads that are connected to test outputters for outputting test signals to the electronic devices and for receiving response signals from the electronic devices. A loading transporter is provided at a frontmost stage of the testers that transports the electronic devices from a previous process conveyance medium to a test tray before loading the electronic devices into the testers. An unloading transporter is provided at a rearmost stage of the testers that unloads the electronic devices from the test tray to a later process conveyance medium corresponding to the response signals. A transporter is provided between the testers that transports the test tray from a previous process tester to a later process tester. The transporter includes a buffer that holds test trays to absorb a waiting time due to differences in processing capacities between test trays.

16 Claims, 18 Drawing Sheets

U.S. PATENT DOCUMENTS

| | | |
|---|---|---|
| 6,563,331 B1 | 5/2003 | Maeng |
| 6,856,128 B2 * | 2/2005 | Ito et al. .................. 324/158.1 |
| 7,405,582 B2 | 7/2008 | Mineo et al. |
| 7,479,779 B2 | 1/2009 | Kikuchi et al. |
| 7,609,052 B2 | 10/2009 | Mizushima et al. |
| 2003/0117161 A1 | 6/2003 | Burn |
| 2007/0013390 A1 | 1/2007 | Kuitani et al. |
| 2007/0159532 A1 | 7/2007 | Kiyokawa |
| 2008/0042667 A1 | 2/2008 | Yamashita et al. |

FOREIGN PATENT DOCUMENTS

| | | |
|---|---|---|
| JP | 2000-241495 | 9/2000 |
| JP | 2002-174659 | 6/2002 |

OTHER PUBLICATIONS

English language Abstract of JP 2000-241495, Sep. 8, 2000.

English language Abstract of JP 2002-174659, Jun. 21, 2002.

* cited by examiner

ELECTRONIC DEVICE TEST APPARATUS FOR SUCCESSIVELY TESTING ELECTRONIC DEVICES

CROSS REFERENCE TO RELATED APPLICATIONS

The present application is a Continuation of U.S. patent application Ser. No. 11/571,428 filed on Mar. 13, 2007, U.S. Pat. No. 7,612,575 which is a National Stage of International Patent Application No. PCT/JP05/13590 filed Jul. 25, 2005, which claims priority under 35 U.S.C.§119 of Japanese Application No. 2004-215802 filed on Jul. 23, 2004, the disclosures of which are expressly incorporated by reference herein in their entireties.

BACKGROUND

1. Technical Field

The present invention relates to an electronic device test apparatus for testing a semiconductor integrated circuit device or other various types of electronic devices.

2. Background Art

In the process of production of semiconductor devices, an electronic device test apparatus becomes necessary for testing the finally produced IC chip or other electronic device. This type of electronic device is tested by setting the test environment to an ordinary temperature, high temperature, or low temperature environment, inputting a test pattern to the IC chip, operating it in that temperature state, and examining the response pattern. This is because the characteristics of an IC chip have to be guaranteed to enable good operation both under ordinary temperature or a high temperature or low temperature.

A conventional general electronic device test apparatus is comprised of a test head provided with a tester in which a program for transmitting a test pattern and examining the response pattern is stored and contact terminals for electrically connecting this tester and electronic devices and a handler for successively conveying a large number of electronic devices to the contact terminals of the test head and physically classifying the electronic devices finished being tested in accordance with the test results. Further, it sets electronic devices at the handler for conveyance to the test head where it presses the electronic devices against the contact terminals of the test head for electrical contact for the purpose of the desired operating test.

However, a conventional handler places a plurality of pretest electronic devices on a tray called a "customer tray" (or "user tray"), sets this in the handler, then transports these electronic devices to a test tray circulating in the handler. The step for making the electronic devices a high temperature or low temperature, a step for pushing the electronic devices against the contact units of the test head and inputting/outputting test signals and their response signals, and a step for returning the electronic devices to ordinary temperature are performed in the state carried on a test tray. The electronic devices are then transported to customer trays in accordance with the final test results.

The work of transporting electronic devices between the customer trays and the test trays has a great effect on the inspection capacity of the handler (throughput). In particular, when the test time in the test process is short, the transport time between the customer trays and the test trays becomes a bottleneck and the throughput of the handler cannot be shortened.

Further, when performing a plurality of tests such as an ordinary temperature test, high temperature test, and low temperature test, if having to transport the electronic devices each time, not only does the throughput of the handler drop, but also various trouble such as electronic devices dropping off or being damaged is liable to occur at the time of transport.

DISCLOSURE OF THE INVENTION

An object of the present invention is to provide an electronic device test apparatus able to shorten the time for transporting electronic devices and improve the throughput of the handler and reduce the trouble at the time of transport.

To achieve the above object, according to the present invention, there is provided an electronic device test apparatus having a plurality of test units on which are mounted test heads connected to testers outputting test signals to the electronic devices and inspecting the response signals, a loading transport unit transporting a plurality of electronic devices from a previous process conveyance medium to a test tray before loading into the test unit, and an unloading transport unit unloading the plurality of electronic devices from a previous process conveyance medium to a later process conveyance medium, wherein the loading transport unit is provided at least at a frontmost stage of the plurality of test units, the unloading transport unit is provided at least at a rearmost stage of the plurality of test units, and the test tray is transported between test units or between units.

In the present invention, in configuring a test process provided with a plurality of test units, the frontmost stage test unit is provided with the loading transport unit, the rearmost stage test unit is provided with a classifying transport unit, and the plurality of test units provided between them convey the electronic devices by test trays.

The tests at the plurality of test units are performed while the electronic devices are carried on the test trays without transport to another conveyance medium in the middle, so the time required for the work of transporting electronic devices from a previous process conveyance medium to a test tray and the work of transporting electronic devices from a test tray to a later process conveyance medium can be shortened and the throughput of the electronic device test apparatus as a whole is improved.

Further, there is little work of transporting electronic devices between another conveyance medium and a test tray. The various trouble arising due to the transport work can be reduced by that amount.

The loading transport unit and classifying transport unit according to the present invention are configured as separate units and may be configured so that the loading transport unit has the function of transporting the plurality of electronic devices from the previous process conveyance medium to a test tray before being loaded on the test unit, while the classifying transport unit has the function of transporting the plurality of electronic devices from a test tray to a later process conveyance medium classified in accordance with the test results. Instead of this, the loading transport unit and classifying transport unit may be configured as a single transport unit and may be configured so that the transport unit has the function of transporting the plurality of electronic devices from the previous process conveyance medium to a test tray before being loaded on the test unit and the function of transporting the plurality of electronic devices from a test tray to a later process conveyance medium classified in accordance with the test results. This configuration of the loading transport unit and classifying transport unit according to the present invention may be set to the optimal mode in accordance with the layout, processing capacity, and test specifications of the plurality of test units.

The test trays according to the present invention are loaded at the loading transport unit with pre-test electronic devices from the previous process conveyance medium, then are successively conveyed to the plurality of test tests until the tested electronic devices are transported at the classifying transport unit to the later process conveyance medium. This test tray conveying means includes not only an automatic conveyor apparatus by a conveyor etc., but also manual conveyance by a conveyance vehicle or manual conveyance by a worker. In particular, when employing an automatic conveyor apparatus, it is possible to convey test trays from the frontmost stage to the rearmost stage of a plurality of test units and from the rearmost stage to the frontmost stage so as to make them automatically circulate through the plurality of test units. This conveyance of test trays according to the present invention enables the optimal mode to be set in accordance with the layout, processing capacity, and test specifications of the plurality of test units.

The plurality of test units according to the present invention are suitably arranged in accordance with the desired layout, but it is also possible to provide a buffer unit able to hold test trays at a test tray conveying means between test units. By providing the buffer unit, it is possible to absorb differences in the processing capacities between test units. Further, even if a test unit temporarily breaks down, the buffer unit can hold the test trays, so the startup time at the time of restoration can be shortened. This buffer unit of test trays according to the present invention can be set to the optimal mode in accordance with the layout, processing capacity, and test specifications of the plurality of test units.

When there is a difference in processing capacity among the plurality of test units according to the present invention, it is possible to make the number of electronic devices carried on the test trays the number of electronic devices processed at the test unit with the minimum processing capacity among the plurality of test units. Further, by sending test trays in parallel to the test units other than the test unit with this minimum processing capacity for testing, it is possible to absorb the differences in processing capacities.

The loading transport unit and classifying transport unit according to the present invention are provided at least at the frontmost stage and the rearmost stage of the test units, but in addition to this, any of the test units may be provided between them with an intermediate conveyance unit for taking out electronic devices carried on the test trays to the outside the process. When any one of the plurality of test units judges that the test results of any one of the electronic devices show a failed device or any one of the plurality of test units suffers from a breakdown in the contact units etc. and cannot perform a test, depending on the number of such occurrences, taking out the electronic devices to the outside of the process in the middle of the test units sometimes improves the overall test efficiency (test time). For this reason, it is possible to provide an intermediate conveyance unit in the middle of the test units and take out electronic devices not requiring subsequent testing or electronic devices requiring retesting to outside the process to improve the overall test efficiency. Note that it is also possible to replace the electronic devices taken out to the outside of the process by using the intermediate conveyance unit to place other electronic devices and to transport the electronic devices taken out to the outside of the process to other test trays.

The test unit according to the present invention mounts at least a test head connected to a tester for outputting test signals to the electronic devices and examining the response signals, but in addition may also include a constant temperature unit for applying thermal stress to the electronic devices and a soak unit for removing thermal stress applied to the electronic devices. When testing electronic devices by a high temperature or low temperature in addition to ordinary temperature, the test unit may raise or lower the temperature of the electronic devices by the constant temperature unit, test them in the desired temperature environment, then return them to ordinary temperature by the soak unit so as to handle tests under various temperature environments.

Sometimes breakdowns or other trouble, differences in processing capacities, differences in test specifications, etc. in the plurality of test units according to the present invention will cause the apparatus not to operate as expected. It is also possible to connect the plurality of test units, loading transport unit, and classifying transport unit by a network or other information communication network to monitor the operating states of the units and select the optimal test unit for loading of the electronic devices based on the monitoring results.

The electronic device test apparatus according to the present invention can be modularized into a handling module and test module. For example, for the handling module, a plurality of handling modules differing in number of simultaneous holding actions when conveying the electronic devices and/or differing in the conveyance speed and thereby differing in throughput are prepared. Further, for the test modules, a plurality of test module differing in the number of simultaneous measurements and the test temperature (temperature regulation function on electronic devices) are prepared.

Further, based on the maximum measurable number of pins of the tester and the number of terminals and test time of the electronic devices, a handling module having an optimal throughput and a test module having the optimal number of simultaneous measurements and/or test temperature are selected and combined to form the electronic device test apparatus.

Due to this, from the relationship between the maximum testable number of pins of the tester and the number of pins of the electronic devices, even if the maximum number of simultaneous measurements is flexibly changed, it is possible to optimize the electronic device test apparatus without causing a reduction in the efficiency of the test apparatus as a whole due to the performance of the handler. As a result, even if the test specifications and test conditions are changed, just the minimum necessary modules need be changed, so the design and development time and production cost can be reduced.

BEST MODE FOR WORKING THE INVENTION

First Embodiment

FIG. 1 to FIG. 6 will be referred to so as to explain a first embodiment of the electronic device test apparatus according to the present invention.

Figure 1:
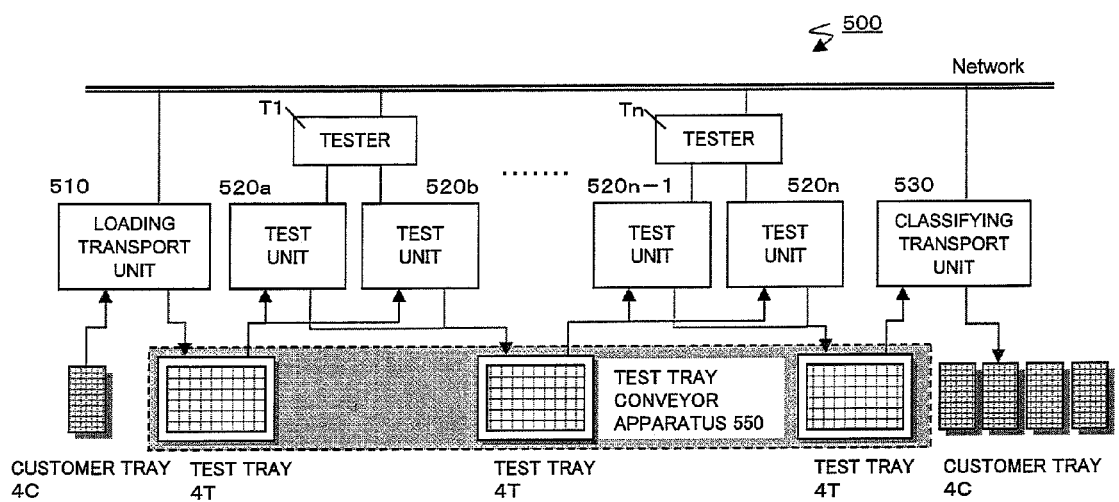
FIG. 1 is a block diagram showing the concept of the electronic device test apparatus according to the present invention.

First, as shown in FIG. 1, the system including the electronic device test apparatus 500 of the present embodiment comprises, from the upstream side, a loading transport unit 510, a plurality of testers T1 ... T$n$, a plurality of test units 520$a$ ... 520$n$, and a classifying transport unit 530 in series.

Each tester T outputs test signals to electronic devices and examines the response signals and is comprised of a test program and a computer for running the same. The tester T is connected through a test signal or other cable to a test head (not shown). This test head is provided with contact units (not shown) for contact with input/output terminals of the electronic devices.

The test unit 520 has a test head unit 521 to which the above-mentioned test head is mounted. As shown in FIG. 1, one tester T1 is provided with for example two test units 520$a$, 520$b$. A plurality of these test units 520 are provided together.

Figure 2:
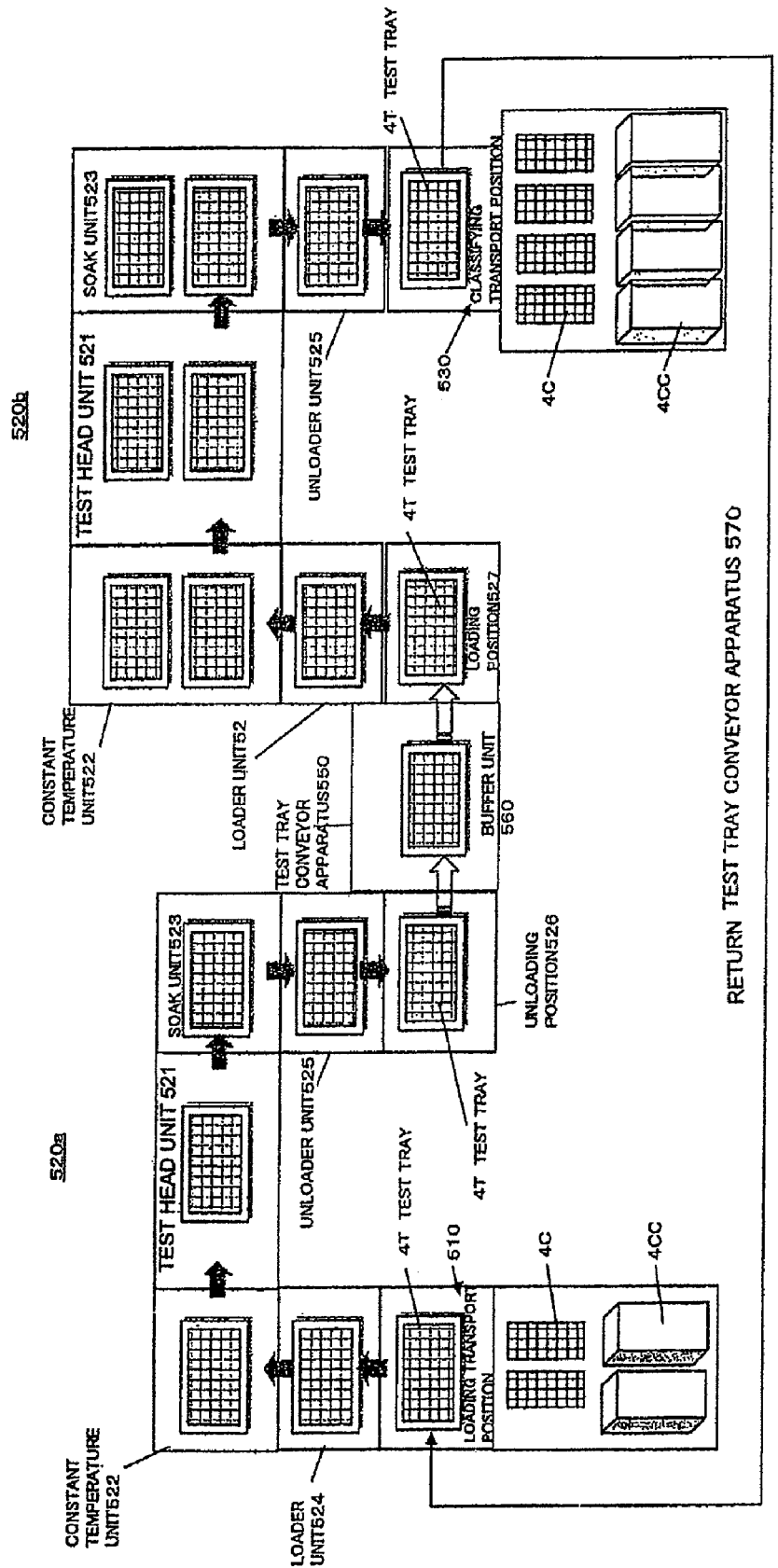
FIG. 2 is block diagram showing an embodiment of the electronic device test apparatus according to the present invention and mainly explains the transfer of test trays etc.

As shown in FIG. 2, in front of the test head unit 521 of the test unit 520 is provided a constant temperature unit 522 for applying thermal stress to the electronic devices. When running a high temperature test, this constant temperature unit 522 may be comprised of a constant temperature tank provided with a heater etc. so as to heat the electronic devices to raise them in temperature. Further, when running a low temperature test, it may be comprised of a constant temperature tank provided with a device for supplying liquid nitrogen or another refrigerant so as to cool the electronic devices to lower them in temperature.

Further, in back of the test head unit 521 of the test unit 520 is provided a soak unit 523 for removing thermal stress applied to the electronic devices. When running a high temperature test, this soak unit 523 may be comprised of a tank having a cooling device for cooling the electronic devices to near room temperature. Due to this, electronic devices raised to a high temperature may be kept from being classified by their temperatures as they are. Further, when running a low temperature test, it may be comprised by a tank having a heater for heating the electronic devices to near room temperature. Due to this, condensation can be prevented from forming on the electronic devices.

Note that test trays 4T may be conveyed to the constant temperature unit 522, test head unit 521, and soak unit 523 in a test unit 520 by for example employing a belt type conveyor, a cylinder type conveyor, etc.

The loading transport unit 510, as shown in FIG. 1, is provided at the frontmost stage test unit 520 of the plurality of test units 520 and transports a plurality of pre-test electronic devices carried on a customer tray 4C to a test tray 4T.

Further, the classifying transport unit 530, as shown in the figure, is provided at the rearmost stage test unit 520$n$ of the plurality of test units 520 and transports the tested electronic devices carried on a test tray 4T to customer trays 4C classified according to the test results.

Figure 3:
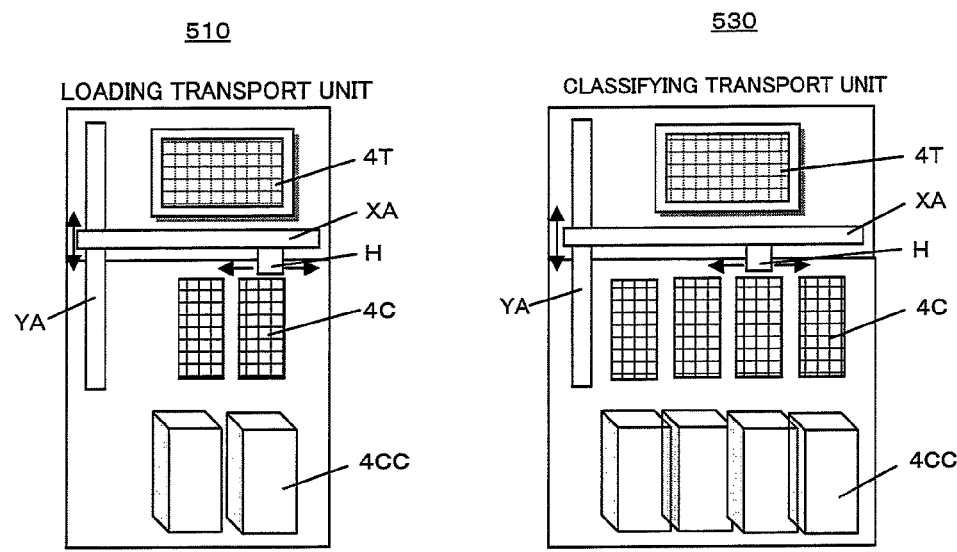
FIG. 3 is schematic view (plan view) showing an embodiment of a loading transport unit and classifying transport unit according to the present invention.

FIG. 3 is a plan view showing specific examples of a loading transport unit 510 and classifying transport unit 530. A suction head H picking up electronic devices carried on a tray is able to move close to and away from the electronic devices (Z-axial direction). Further, this suction head H is able to move along an X-axis arm XA in the X-axial direction in a plane vertical to the Z-axial direction. Further, the X-axis arm XA is able to move along a Y-axis arm YA in the Y-axial direction in a plane vertical to the Z-axial direction. Using this 3D pickup and place apparatus, the loading transport unit 510 shown at the left of FIG. 3 can pick up and hold a pre-test electronic device carried on a customer tray 4C by the suction head H, move it to a predetermined position of the test tray 4T, and release the picked up and held electronic device. By repeating this operation, the pre-test electronic devices carried on the customer tray 4C are transported to the test tray 4T. Note that as another mode of the loading transport unit 510, there is also a mode which picks up and holds a plurality of electronic devices from a customer tray 4C all together and transports them to a test tray 4T.

The classifying transport unit 530 shown at the right of FIG. 3 can pick up and hold a tested electronic device carried on a test tray 4T by the suction head H, move it to a predetermined tray position in accordance with the test results among the plurality of customer trays 4C, and release the picked up and held electronic device. By repeating this operation, the tested electronic devices carried on the test tray 4T are transported classified to the customer trays 4C. Note that as another mode of the classifying transport unit 530, there is also a mode which picks up and holds a plurality of electronic devices from a test tray 4T all together and transports them to a customer tray 4C in accordance with their classification.

Note that in the electronic device test apparatus 500 shown in FIG. 1 and FIG. 2, the frontmost stage test unit 520a and the rearmost stage test unit 520n of the plurality of test units 520 are provided at separated positions, so the loading transport unit 510 and the classifying transport unit 530 are comprised of separate units, but depending on the layout of the plurality of test units 520, the frontmost stage test unit 520a and the rearmost stage test unit 520n of the plurality of test units 520 may also be laid out at the same position or at extremely close positions. In such a case, the loading transport unit 510 and classifying transport unit 530 may be comprised of the same unit.

Figure 4:
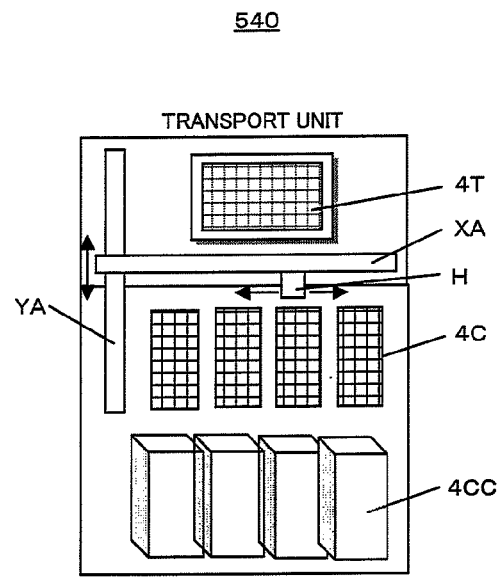
FIG. 4 is schematic view (plan view) showing another embodiment of a loading transport unit and classifying transport unit according to the present invention.

FIG. 4 is a schematic view (plan view) showing an embodiment of a transport unit 540 provided with both the function of a loading transport unit 510 and the function of a classifying transport unit 530. A suction head H picking up an electronic device carried on a test tray 4T or a customer tray 4C is able to move close to or away from the electronic devices (Z-axial direction). Further, this suction head H is able to move along an X-axis arm XA in the X-axial direction in the plane vertical to the Z-axial direction. Further, the X-axis arm XA is able to move along the Y-axis arm YA in the Y-axial direction in the plane vertical to the Z-axial direction.

The basic configuration of a 3D pickup and place apparatus is the same as that shown in FIG. 3. Control can be switched between the case of making it function as a loading transport unit 510 and the case of making it function as a classifying transport unit 530. That is, when transporting pre-test electronic devices from a customer tray 4C to a test tray 4T, the operational control program is switched to the specifications of the loading transport unit 510, while when transporting tested electronic devices from a test tray 4T classified to customer trays 4C, the operational control program is switched to the specifications of the classifying transport unit 530.

By this single 3D pickup and place apparatus performing the work of loading transport and the work of classifying transport, it is possible to reduce the installation costs of the units. Further, cost merits can also be expected due to use of common specification units.

Note that a transport unit 540, shown in FIG. 4 and provided with both the loading transport function and classifying transport function may be arranged at both the frontmost stage test unit 520a and the rearmost stage test unit 520n of the plurality of test units 520.

Returning to FIG. 1 and FIG. 2, between the classifying transport position of the first test unit 520a and the loading transport position of the second test unit 520b is provided a test tray conveyor apparatus 550 comprised of a belt conveyor etc. for conveying test trays 4T. Similarly, between the n−1-th test unit 520n−1 and n-th test unit 520n is provided a test tray conveyor apparatus 550. Further, along this conveyance route is provided a buffer unit 560 holding one or more test trays 4T. This is designed to be able to absorb the waiting time due to the difference in processing capacities between test trays. Further, a return test tray conveyor apparatus 570 for returning a test tray 4T, emptied after the tested electronic devices are transported to the customer tray 4C at the classifying transport position of the rearmost stage test unit 520n, to the loading transport position of the frontmost stage test unit 520a is provided between the rearmost stage test unit 520n and the frontmost stage test unit 520a. This return test tray conveyor apparatus 570 can also be configured by a belt conveyor etc., but manual conveyance by a worker or manual conveyance by a conveyance vehicle is also possible.

Note that pockets of the test tray 4T for holding electronic devices are shaped and arranged corresponding to the number of contact units (number of sockets) of the test head mounted at the test unit 520. For example, when the test head has 32 sockets (4 columns×8 rows), 64 sockets (8 columns×8 rows), or 128 sockets (8 columns×16 rows), the test tray 4T has 32 pockets for holding electronic devices (4 columns×8 rows), 64 pockets (8 columns×8 rows), and 128 pockets (8 columns×16 rows).

Further, as shown in FIG. 2, for example, when the test head mounted at the first test unit 520a has 32 sockets (4 columns×8 rows) and the test head mounted at the second test unit 520b has 64 sockets (8 columns×8 rows), each test tray 4T is made to store 32 electronic devices (4 columns×8 rows) so as to match with the number of sockets of the first test unit 520a with the low processing capacity. When testing electronic devices by the second test unit 520b, as shown in the figure, the test head unit 521 of the test unit 520b conveys two test trays 4T, 4T in parallel and tests the electronic devices on the two test trays 4T, 4T in accordance with the processing capacity of this test unit 520b.

When sending test trays 4T to a plurality of test units 520a, 520b with different processing capacities, it is possible to test all electronic devices carried on a test tray 4T and suppress the occurrence of waiting time at the test unit 520b with a high processing capacity by setting the number of electronic devices on the test tray 4T to match with the number of sockets of the test unit 520a with the lowest processing capacity.

The procedure for testing electronic devices using the electronic device test apparatus 500 of the above configuration will be explained with reference to FIG. 2. In the electronic device test apparatus 500 shown in FIG. 2, the first test unit 520a runs a high temperature test and the second test unit 520b runs a low temperature test. Further, as explained above, the first test unit 520a has a processing capacity half that of the processing capacity of the second test unit 520b. More specifically, assuming the first number of simultaneous measurements is 32 electronic devices and the second number of simultaneous measurements is 64 electronic devices, each test tray 4T is designed to hold 32 electronic devices.

First, a customer tray 4C carrying a plurality of electronic devices (or a plurality of such customer trays stacked in a customer tray cassette 4CC) is set at a customer tray position of the loading transport unit 510. The 3D pickup and place apparatus picks up and transports pre-test electronic devices carried on the customer tray 4C to the test tray 4T one or more at a time. As shown in FIG. 2, when one test tray 4T is filled with 32 electronic devices, the test tray 4T is conveyed from the loading transport position up to then to the loader unit 524 by a belt conveyor etc. and then conveyed from there to a constant temperature unit 522.

The constant temperature unit 522 is comprised of a constant temperature chamber set to a predetermined high temperature, so if loading a test tray 4T into the constant temperature unit 522, each electronic device is given thermal stress of a predetermined temperature so that the electronic device is raised to the target temperature. Note that in the case of an ordinary temperature test, this constant temperature unit 522 and the later explained soak unit 523 are omitted or the inside of the chamber is set to an ordinary temperature. The test tray 4T is then simply passed through this chamber.

The test tray 4T with the electronic devices raised to the target temperature by passing through the constant temperature unit 522 is conveyed to the next test head unit 521 where the terminals of the 32 electronic devices are simultaneously brought into contact with the contact units of the not illustrated test head. During this time, test signals from the tester T are sent to the electronic devices, Response signals from the electronic device side to these are returned from the contact units. By judging the state of the response signals at this time (logic level, amplitude, timing, etc.), the tester T judges whether the quality (presence of any operational defects) and operating speed (high speed, medium speed, and low speed) of the electronic devices. The information of this judgment result is stored in the control system (not shown) of the test unit 520 or the tester T linked with the holding positions (pocket positions) of the test tray 4T. Based on the information of this judgment result, the operations of the later processes are controlled.

When the tests at the test head unit 521 are finished, the test tray 4T is conveyed to the soak unit 523 where the electronic devices are cooled to near ordinary temperature. The test tray 4T carrying the electronic devices soaked at the soak unit 523 is conveyed to an unloader unit 525 and is further conveyed to an unloading position 526 from which a test tray conveyor apparatus 550 conveys it to the loading position 527 of the second test unit 520b. Note that depending on the processing capacities of the first test unit 520a and the second test unit 520b and the state of any trouble, the test tray 4T is temporarily held at a buffer unit 560 provided in the middle of the test tray conveyor apparatus 550, then is conveyed to the loading position 527 of the second test unit 520b.

The test tray 4T reaching the loading position 527 of the second test unit 520b is conveyed to the loader unit 524. There, it is arranged in parallel with another tray and conveyed to the constant temperature unit 522.

The constant temperature unit 522 is comprised of a constant temperature chamber set to a predetermined low temperature, so if loading a test tray 4T into the constant temperature unit 522, the electronic devices are given thermal stress of a predetermined temperature and the electronic devices are raised to the target temperature.

Two test trays 4T, 4T with electronic devices raised to the target temperature by passing through the constant temperature unit 522 are conveyed in parallel to the next test head unit 521. Here, the terminals of 32×2 electronic devices are simultaneously brought into contact with the contact units of the not shown test head. During this time, test signals from the tester T are sent to the electronic devices and response signals from the electronic device side are returned from the contact units to the tester T. By judging the state of the response signals at this time, the tester T judges the quality (presence of any operational defects) and operating speed (high speed, medium speed, and low speed) of the electronic devices. The information of this judgment result is stored in the control system (not shown) of the test unit 520 or tester T linked with the holding positions (pocket positions) of the test tray 4T. The later process operation is controlled based on this judgment result information.

When the tests at the test head unit 521 are finished, the two test trays 4T, 4T are conveyed to the soak unit 523 where the electronic devices are heated to near ordinary temperature. Due to this, condensation can be prevented from forming on the electronic devices. The test trays 4T carrying the electronic devices soaked at the soak unit 523 are conveyed to an unloader unit 525 and are further conveyed to the classifying transport position of the classifying transport unit 530, where the control systems of the test units 520a, 520b storing the test results sends the classifying transport unit 530 the data of the test results for each holding position of the test trays 4T, then the 3D pickup and place apparatus of the classifying transport unit 530 transports the electronic devices to the customer trays 4C in accordance with the test results of the first test unit 520a and the test results of the second test unit 520b.

When all of the electronic devices are transported classified to the customer trays 4C, the emptied test trays 4T are returned by the return test tray conveyor apparatus 570 to the loading transport position of the loading transport unit 510 of the first test unit 520a.

Above, when subjecting the electronic devices to a high temperature test and low temperature test, the electronic devices are conveyed to the first test unit 520a and the second test unit 520b by the same test tray 4T without returning them once to any customer tray 4C, the time for transport to the customer trays 4C can be eliminated, so an improvement in the throughput of the conveyance system can be realized. Further, the number of times of transport to customer trays 4C can be greatly reduced, so the probability of occurrence of trouble during transport work is reduced.

Incidentally, in FIG. 2, the explanation was given using as an example a system of an electronic device test apparatus 500 using two test units 520a, 520b, but the present invention can also be applied to a system using three or more test units 520. Further, it may be applied to a system provided with a plurality of test units 520 with the same processing capacities.

Further, in the embodiment shown in FIG. 1 and FIG. 2, the frontmost stage 520a of the test unit 520 is provided with a loading transport unit 510, while the rearmost stage 520n of the test unit 520 is provided with a classifying transport unit 530, but in this case, it is also possible to provide an intermediate conveyance unit 580 for taking out electronic devices carried on a test tray 4T to the outside of the process between the test units 520.

An example of a preferable case of provision of an intermediate conveyance unit 580 will be explained with reference to FIG. 5 and FIG. 6.

Figure 5:
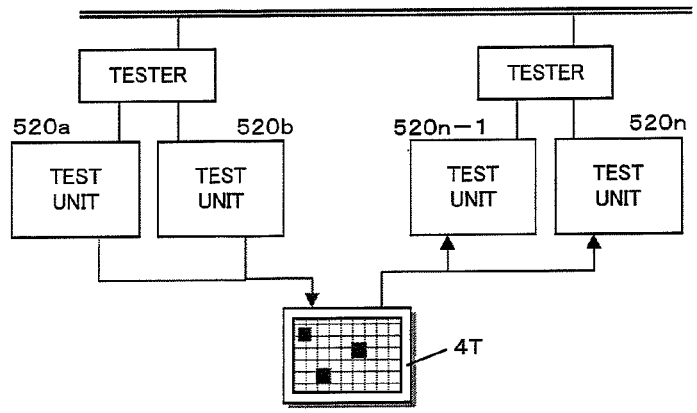
FIG. 5 is block diagram showing the concept of another embodiment of the electronic device test apparatus according to the present invention.

In testing electronic devices, when using a plurality of connected test units 520 to conduct various tests on the electronic devices, for example as shown in FIG. 5, sometimes several (in the figure, three) of the 32 electronic devices in carried on the test tray 4T will be judged as failed due to the results of the test. On the other hand, the sockets of the contact units of the test head are repeatedly contacted hundreds of thousands of times, so the sockets sometimes become defective along with physical or electrical defects or unstable contact. However, the soaking and heat stabilization at the constant temperature unit 522 and the test head unit 521 take time, so even when sockets become defective, they are not immediately replaced. Defective sockets are repaired and inspected at the stage where a production lot finishes being tested, while operation is suspended, at the time of periodic maintenance, and other such timings. For this reason, some defective sockets are prevented from conducting tests (hereinafter referred to as "turning sockets off") by controlling the tests for each socket. Therefore, an electronic device placed at a defective socket has to be retested since the socket is turned off. Further, some of the defective sockets will degrade or damage electronic devices, so preferably electronic devices are not mounted there. Conversely, if electronic devices are not placed at normal sockets and the sockets are left empty, the number of simultaneous measurements will fall, so the throughput will fall.

On the other hand, an electronic device judged in the previous process to have failed does not have to be sent to the rearmost stage test unit 520n, so discarding it in the middle of the test process or, if retesting is necessary, returning it to a predetermined test unit 520 would improve the test efficiency of the process as a whole.

Figure 6:
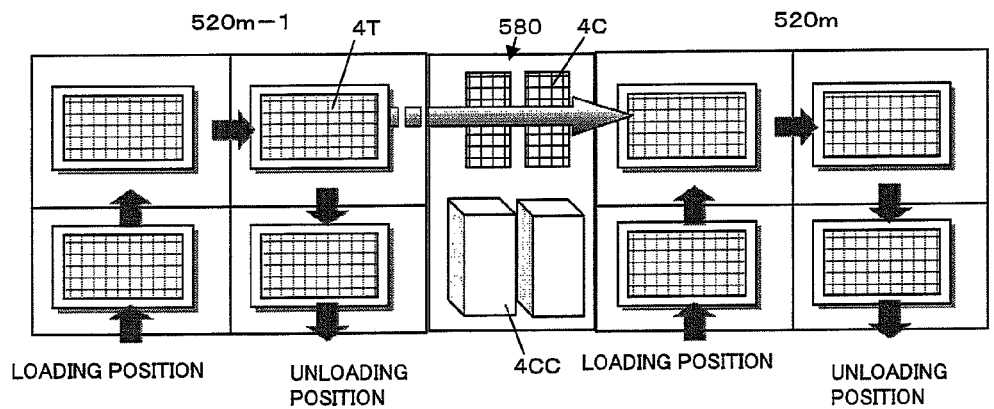
FIG. 6 is block diagram showing an embodiment of an intermediate conveyance unit according to the present invention.

For this reason, it is possible to provide an intermediate conveyance unit 580 as shown in FIG. 6 between the adjoining test units 520. The intermediate conveyance unit 580 preferably rearranges the electronic devices so that the number of devices which can be simultaneously measured in the next process becomes the maximum. This intermediate conveyance unit 580 is provided between the previous stage test unit 520*m*-1 and the later stage test unit 520*m*. It has a 3D pickup and place device of the same type of configuration as that of the already explained loading transport unit 510 or classifying transport unit 530. Further, as shown in the same figure, any electronic device judged by the previous stage test unit 520*m*-1 to be have failed is placed on a customer tray 4C and ejected out of the process even in the middle of the test process. Further, by placing an electronic device from a customer tray 4C in a pocket of the test tray 4T emptied by the ejection, the number of simultaneous measurements in the next process can be maximized. However, if there is a defective socket in the later process, no electronic device is placed at the defective socket. Further, any electronic device judged passing in the previous process is directly transported from the test tray 4T of the previous stage test unit 520*m*-1 to the test tray 4T of the later stage test unit 520*m*. Further, a customer tray 4C can be utilized as a temporary buffer, so fluctuations in processing time in the previous process and fluctuations of processing time in the later process can be flexibly handled. Note that FIG. 6 shows a specific example of using a plurality of stacked customer tray cassettes 4CC, but the customer trays 4C can be replaced by use of test trays 4T as well to realize the configuration.

Further, when the electronic devices are electronic devices with long test times like large capacity memory devices, the intermediate conveyance unit 580 effectively functions. That is, the previous process test unit 520*m*-1 performs inspections finishing in a short time (for example, 1 minute or so) by a test program testing electronic devices for basic functional operations. Further, failed electronic devices detected in this previous process are ejected by the intermediate conveyance unit 580 and all passing electronic devices are transported to the test tray 4T so that even in the later processes, the test tray 4T carries all passing electronic devices, so the tests can be conducted with the maximum number of simultaneous measurements at all times. Further, the later process test unit 520*m* performs inspections taking a long time (for example 10 minutes or so) by a test program testing electronic devices for all functional operations. Due to this, the test efficiency of the process as a whole is improved.

However, sometimes it is desired to configure a system even when the previous process test tray 4T and the later process test tray 4T are not structured the same (number of simultaneous measurements, size, shape, etc.) In such a case, while the illustration is omitted, the intermediate conveyance unit 580 shown in FIG. 6 is made an intermediate conveyance unit provided with another mode of tray changing function. Specifically, this intermediate conveyance unit is provided with a stocker holding the previous process test trays 4T and a stocker holding later process test trays 4T. After electronic devices carried on a loaded previous process test tray 4T are transported to an unloaded later process test tray 4T, the emptied previous process test tray is held in the previous process test tray stocker.

By interposing an intermediate conveyance unit provided with such a tray changing function, it is possible to rearrange electronic devices on a different structure test tray. Due to this, even handlers differing in test tray structure can be combined to form a flexible system, so facilities can be effectively used.

Above, the use of this intermediate conveyance unit 580 enabled failed electronic devices to be eliminated and an increase in the number of simultaneous measurements accompanying the elimination of failed electronic devices. As a result, the test efficiency (test time) in the later process can be improved. Further, it is possible to eliminate the placement of electronic devices at defective sockets at a later process, so unnecessary degradation or damage to electronic devices can be avoided.

Figure 7:
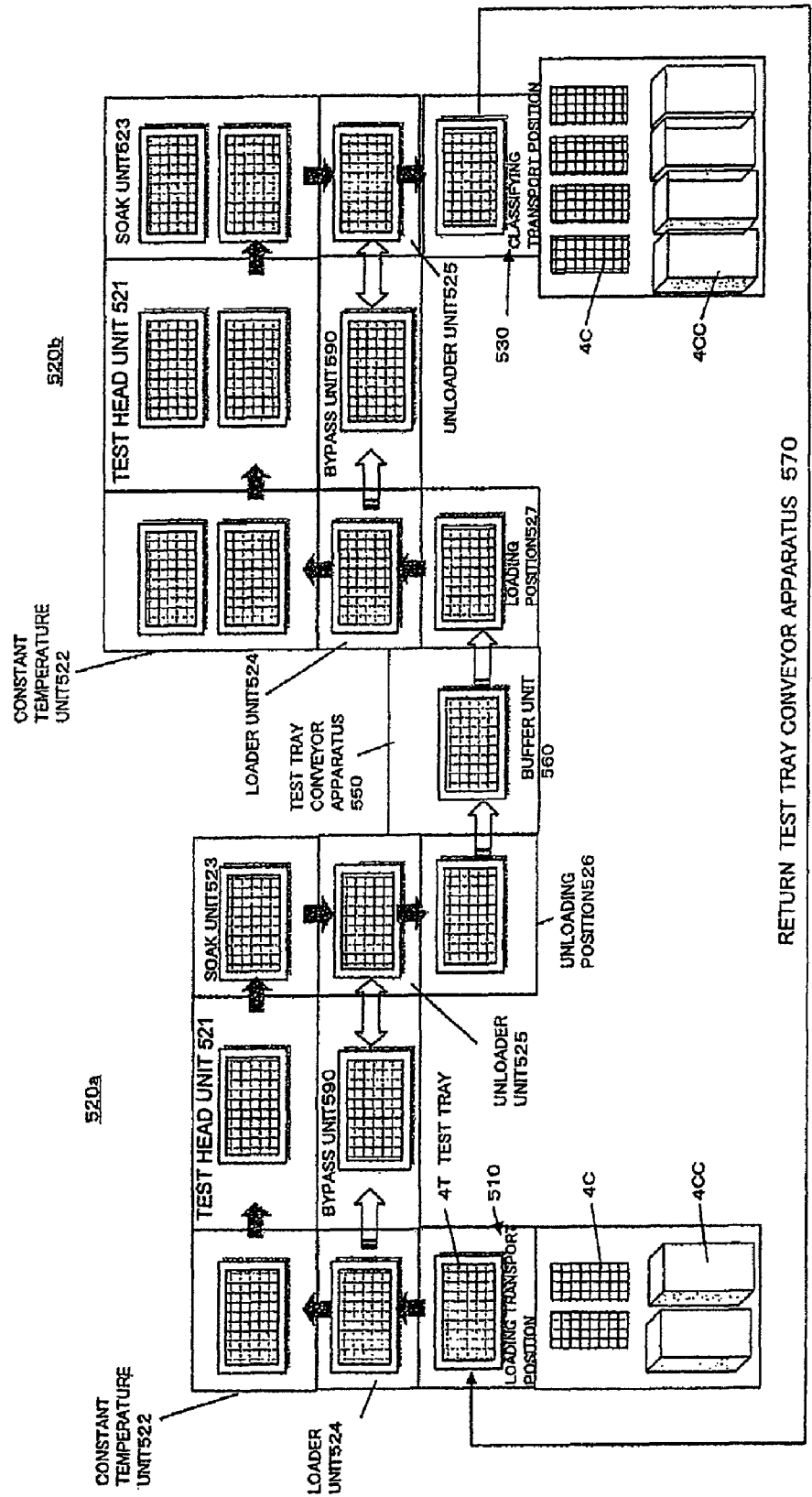
FIG. 7 is block diagram showing another embodiment of the electronic device test apparatus according to the present invention.

FIG. 7 shows another embodiment of the present invention comprised of the configuration of FIG. 2 plus a bypass unit 590. The bypass unit 590 receives test trays 4T of the loader unit 524 and transports it to the unloader unit 52. Here, when the bypass unit 590 is necessary, it is preferable to make it a modular structure to enable connection to the test unit 520.

By providing this bypass unit 590, it is possible to form a bypass route for supplying test trays 4T at the loading transport unit 510 to the next process test unit 520*b* as they are. As a result, it becomes possible to have a plurality of test units 520*a*, 520*b* run tests under the same test conditions (for example, a high temperature test) simultaneously in parallel. Therefore, it is possible to serially connect a desired number of test units of the same test conditions and run tests under the same test conditions simultaneously in parallel. Further, it is also possible to freely change the number of test units connected. Further, by the bypass unit 590 not blocking the transport route, it is possible to stop the constant temperature unit 522, test head unit 521, and soak unit 523 at any time for periodic maintenance work or repair work without stopping the system of the electronic device test apparatus 500, so the system can be improved in operating time. Further, it is possible to utilize the bypass unit 590 to convey empty trays or to supply test trays 4T carrying untested electronic devices to the later process.

Figure 8:
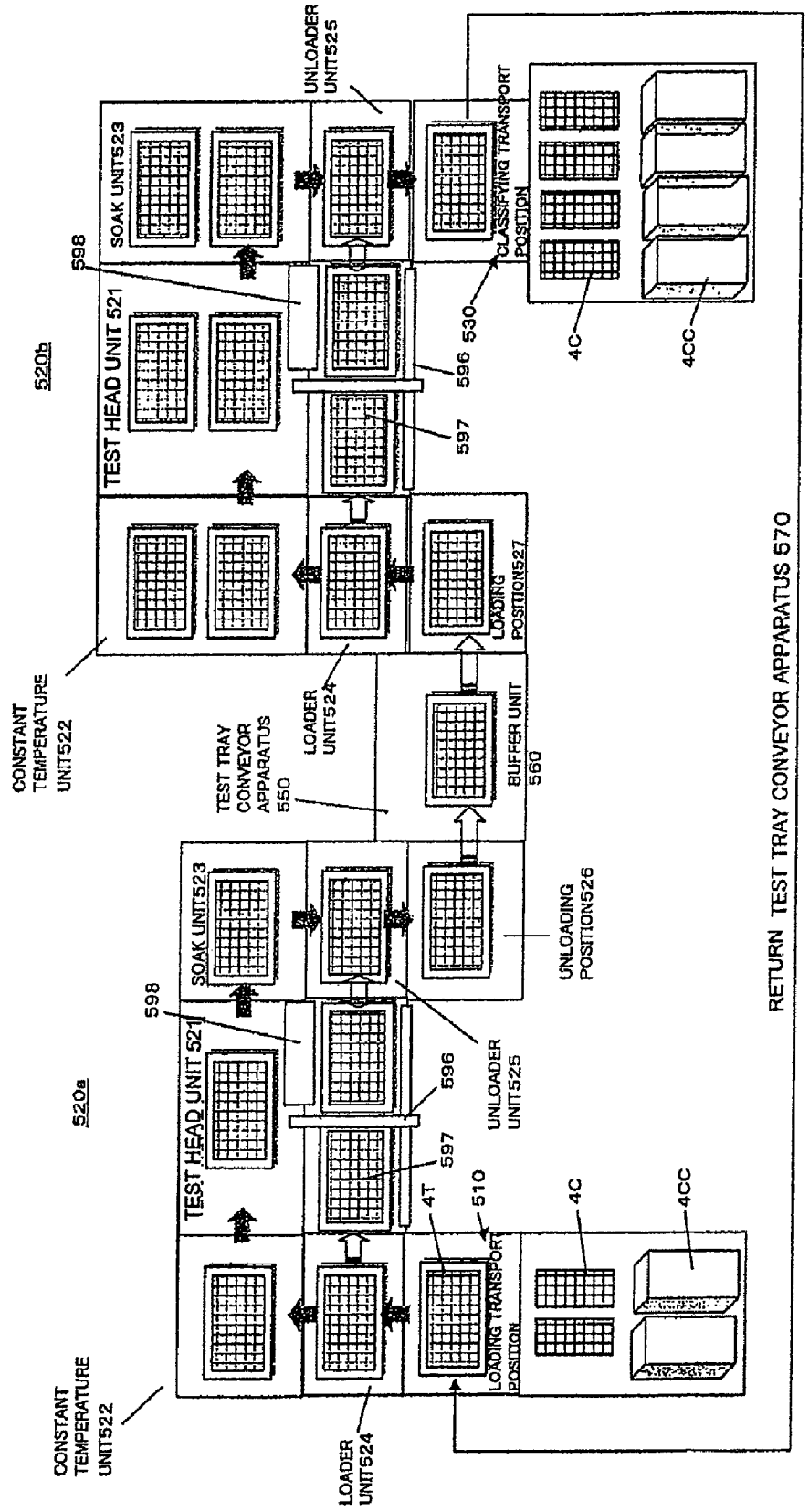
FIG. 8 is block diagram showing another embodiment of the electronic device test apparatus according to the present invention.

FIG. 8 shows another embodiment of the present invention comprised of the configuration of FIG. 2 plus the device transport unit 597. Here, when the device transport unit 597 is necessary, it is preferable to make the structure an interchangeable modular structure to enable connection to the test unit 520. The device transport unit 597 is provided with a 3D pickup and place device 596, a buffer tray 598, and a test tray transport apparatus. Here, the test tray transport apparatus can move test trays 4T from the loader unit 524 side to the unloader unit 525 side, can move them from the unloader unit 525 side to the loader unit 524 side, can move them back and forth to and from the loader unit 524, can move them back and forth to and from the unloader unit 525, and can stop them in the middle of the process.

As a result, the buffer tray 598 can temporarily store untested electronic devices U-DUT from the loader unit 524 before testing, failed electronic devices F-DUT judged to have failed from the unloader unit 525 after testing, and passed electronic devices P-DUT judged to have passed. Further, the number of the U-DUTs, F-DUTs, and P-DUTs held at the buffer tray 598 and the management information of the electronic devices can be managed at the test unit 520 and electronic device test apparatus 500. The 3D pickup and place apparatus 596 can transport electronic devices between the buffer tray 598 and a test tray 4T and by the test tray 4T itself.

The mode of utilization of the device transport unit 597 shown in FIG. 8 will be explained.

First, the first transport mode is the function of returning electronic devices to the loader unit 524 for retesting. That is, if the test unit 520 detects contact failure along with trouble in sockets of the test head unit 521, sometimes the electronic devices are desirably retested. In this case, first, the test tray 4C ejected to the unloader unit 525 is temporarily moved to the device transport unit 597 and the electronic devices to be retested are transported to a buffer tray 598. Next, when transporting the electronic devices from a customer tray 4C to a test tray 4T at the loading transport unit 510, control is performed so that there are empty pockets. The test tray 4T given the empty pockets is temporarily transported to the device transport unit 597 where the electronic devices are transported again from the buffer tray 598 to the empty pockets. After this, the test tray 4T is returned to the loader unit 524, whereby the electronic devices are retested.

The second transport mode is the function of concentrating failed electronic devices F-DUT confirmed to have failed by the test unit 520 at a single tray. That is, when a test tray 4T ejected from the soak unit 523 to the unloader unit 525 has failed electronic devices F-DUT confirmed to have failed by the test unit 520, the test tray 4T is made to move to the device transport unit 597 where the failed electronic devices F-DUT are transported to the buffer tray 598. The test tray 4T is moved to the unloading position 526 and moved to the later process. Finally, when the number of the failed electronic devices F-DUT transported to the buffer tray 598 reach the number of one test tray (for example, 64) or the desired number in the vertically connected test units 520 as a whole (for example, close to 64), an empty tray is received from the loading transport unit 510 through the loader unit 524 and failed electronic devices F-DUT at the buffer tray 598 are transported to the empty tray. The failed device-carrying tray is conveyed through the unloading position 526 to the later process. Further, when there are still empty slots at the failed device-carrying tray, the same method as explained above is used to transport failed electronic devices F-DUT judged to have failed at the later process test unit 520. The failed electronic devices F-DUT carried on the failed devices-carrying tray are ejected by the later stage classifying transport unit 530 or buffer unit 560 to the outside. Due to this, it is possible to successively recover and convey failed electronic devices F-DUT judged to have failed at any test process in the middle and avoid unnecessary testing at test units 520 in the processes. As a result, a reduction in the number of simultaneous tests can be prevented.

The third transport mode is provided with the function of transporting passed electronic devices P-DUT to empty pockets so as to realize the maximum number of simultaneous measurements in the later process and the function of removing electronic devices from pockets corresponding to defective sockets. That is, first, when desiring to temporarily transport passed electronic devices P-DUT to a buffer tray 598, a test tray 4T ejected to the unloader unit 525 is temporarily moved to the device transport unit 597 where the desired number of passed electronic devices P-DUT (for example, the 64 of the number of one test tray) are transported to the buffer tray 598. Further, the test tray is sent as an empty tray to the later process.

Next, a test tray 4T ejected to the unloader unit 525 after this is temporarily moved to the device transport unit 597 so that the tests in the next process become the maximum number of simultaneous measurements. First, for the failed electronic devices F-DUT, the failed electronic devices F-DUT are transported to the buffer tray 598, then passed electronic devices P-DUT on the buffer tray 598 are transported to those pockets. However, if there are defective sockets in the next process, the pockets corresponding to those defective sockets are left empty through elimination. After this, the tray is sent through the unloader unit 525 from the unloading position 526 to the next process.

According to this transport mode, the tests in the next process become the maximum number of simultaneous measurements at all times. As a result, the throughput of the device tests is improved. Further, when the number of passed electronic devices P-DUT on the buffer tray 598 becomes sufficiently larger than for example the number on one test tray, it is possible to receive an empty tray from the loading transport unit 510, transport the electronic devices to it, then send it on to the next process.

The fourth transport mode is a function of making a previous process test tray bypass processing. That is, a function similar to that of the bypass unit 590 shown in FIG. 7 can be realized. For example, a test tray 4T of the loader unit 524 is received and transported to the unloader unit 525 without any processing. According to this, it is possible to form a bypass route for supplying test trays 4T at the loading transport unit 510 as they are to the next process test unit 520b. As a result, this enables a plurality of test unit 520a, 520b to run tests under the same test conditions (for example, a high temperature test) simultaneously in parallel. Further, by the device transport unit 597 not blocking the bypass route, the constant temperature unit 522, test head unit 521, and soak unit 523 can be stopped at any time without stopping the system of the electronic device test apparatus 500 and periodic maintenance work or repair work can be performed.

The fifth transport mode is an example of a configuration using a test tray 4T (buffer test tray) for the buffer tray 598 shown in FIG. 8. In this case, it is desirable to provide a buffer test tray for holding failed electronic devices F-DUT and a buffer test tray for holding passed electronic devices P-DUT. Further, a tray transport mechanism is provided for advancing or retracing to and from a position not interfering with the route of movement of test trays 4T of the device transport unit 597. Of course, the buffer test tray can be moved at any time as an ordinary test tray 4T. According to this, a buffer test tray filled up or with the desired number of electronic devices can be transported to the next process, so the transport processing can be reduced.

The sixth transport mode may be provided with a holding structure able to hold a plurality of test trays or provided with a stocker structure so that a large number of test trays can be held. In this case, it is possible to impart a buffer function to a test tray and possible to absorb temporary fluctuations in processing capacity between the previous process and the next process. As a result, greater freedom in operation is possible.

Figure 9:
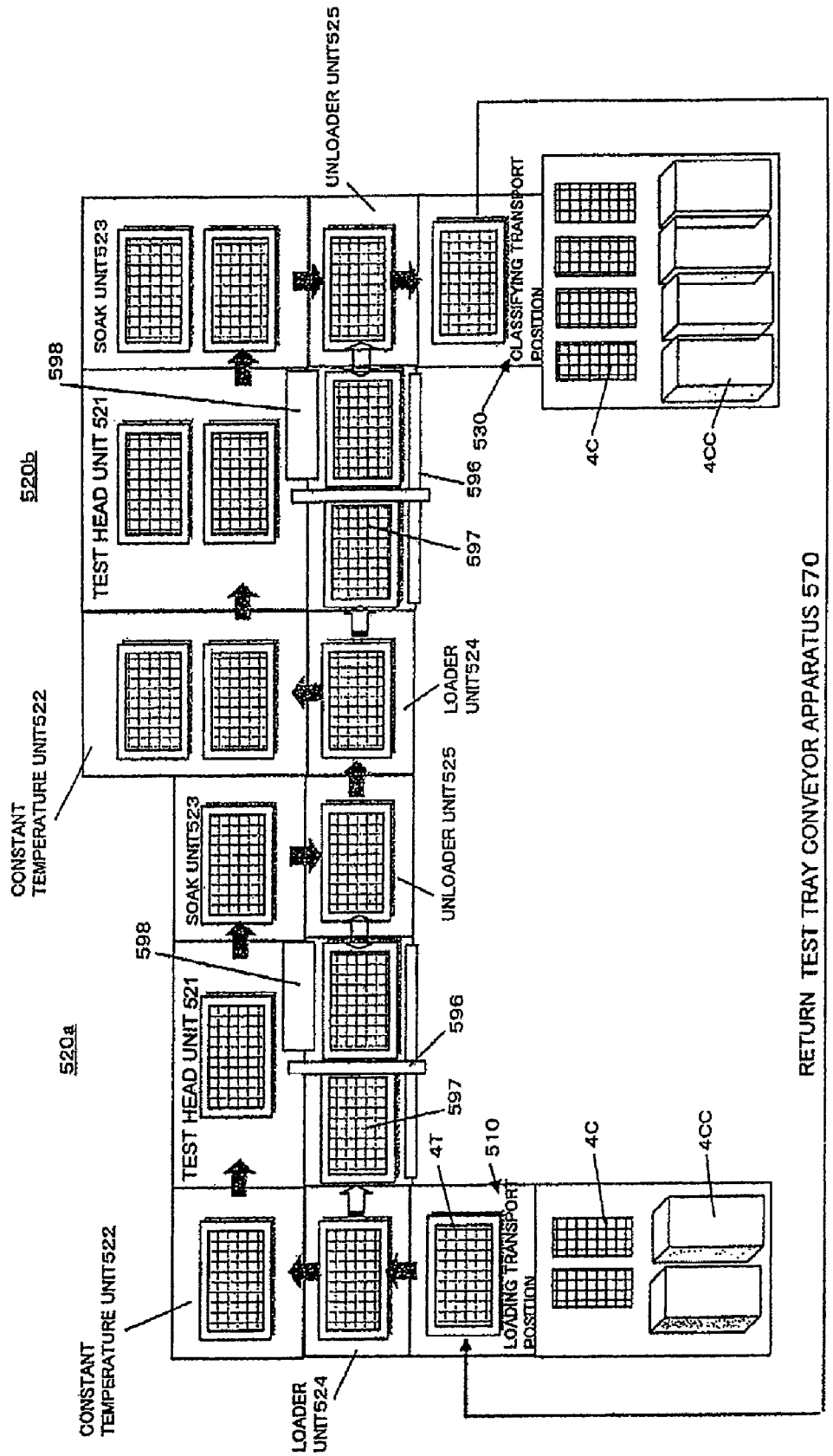
FIG. 9 is block diagram showing another embodiment of the electronic device test apparatus according to the present invention.

FIG. 9 shows another embodiment of the present invention comprised of the configuration of FIG. 8 minus the buffer unit 560 and instead changed to a directly connected unloader unit 52b and directly connected loader unit 524b. This is a configuration of the previous process test unit 520a and the next process test unit 520b directly connected together. Here, the directly connected unloader unit 52b and directly connected loader unit 524b, when necessary, may be made interchangeable modular structures so as to enable connection with the test units 520a, 520b.

The directly connected unloader unit 52b, as explained above, transports a test tray 4T with the transport unit 59 to the next process directly connected loader unit 524b so as to enable testing by the maximum number of simultaneous measurements in the next process. Further, the directly connected loader unit 524b transports a test tray 4T from the previous process directly connected unloader unit 52b to the constant temperature tank 522. Further, the directly connected loader unit 524b transports a received test tray 4T to the transport unit 597 in the case of an empty tray and in the case carrying failed electronic devices F-DUT. Therefore, according to the example of the configuration of FIG. 9, it is possible to directly connect previous and later test units 520a, 520b.

Even if eliminating the intermediate conveyance unit 580, the next process can test the electronic devices by the maximum number of simultaneous measurements. As a result, the apparatus can be configured inexpensively and space can be saved.

Figure 10:
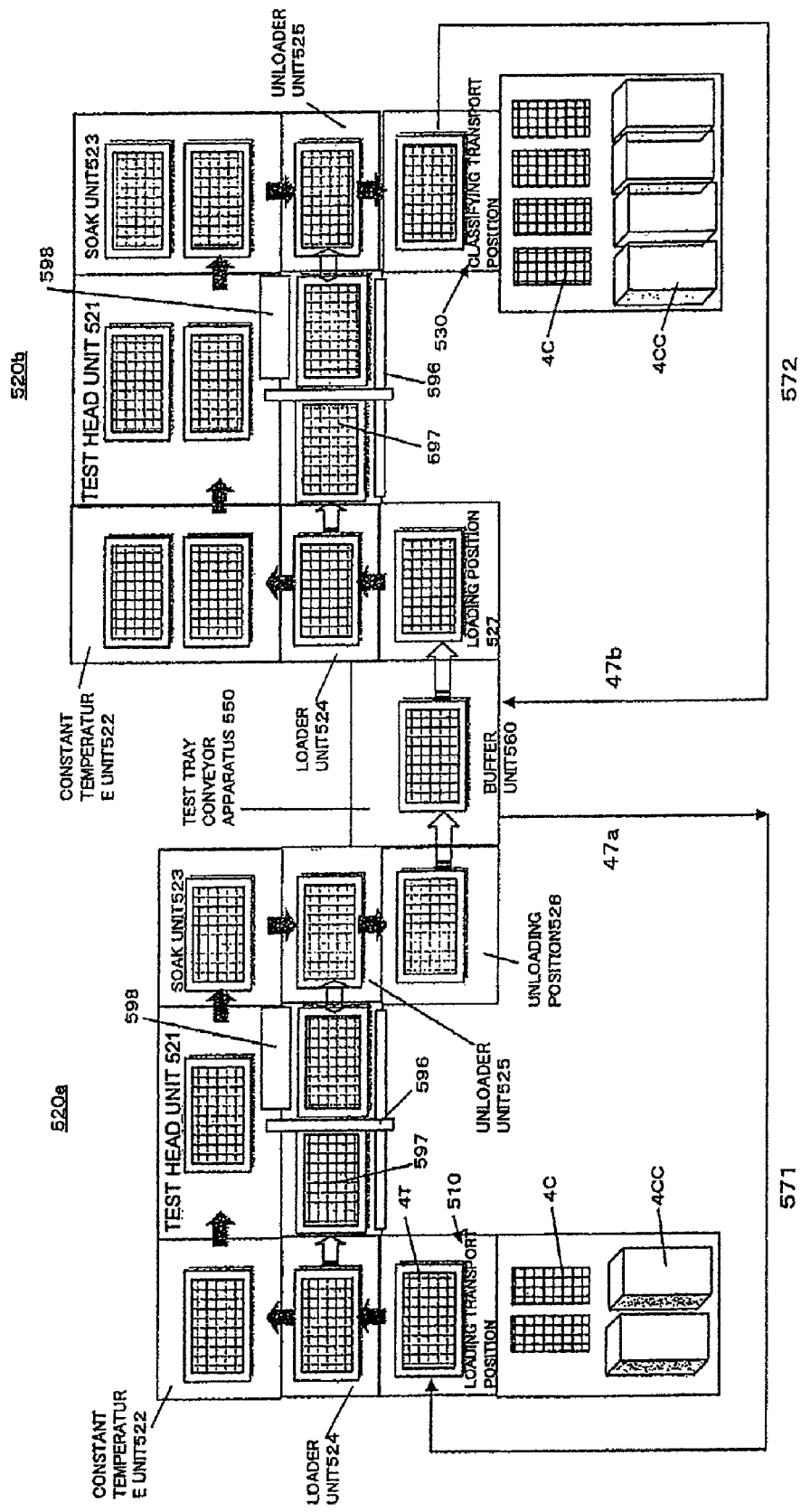
FIG. 10 is block diagram showing another embodiment of the electronic device test apparatus according to the present invention.

FIG. 10 is an example of the system configuration in the case of operating of the test trays 4Ta, 4Tb of two different types of structures. In the previous process test unit 520a, the first test tray 4Ta is used to convey electronic devices, while in the later process test unit 520b, the second test tray 4Tb is used to convey electronic devices. Further, FIG. 10 shows an example of using only a single test unit 520a in the previous process, but it is also possible to serially connect a desired plurality of test units 520a to realize the configuration. Similarly, FIG. 10 shows an example of using only a single test unit 520b in the later process, but it is also possible to serially connect a desired plurality of test units 520b to realize the configuration.

Further, FIG. 10 shows use of an intermediate conveyance unit 580b. Here, the intermediate conveyance unit 580b transports electronic devices between test trays, sends an emptied first test tray 4Ta through a first external conveyor apparatus 571 to a loading transport unit 510, and receives an emptied second test tray 4Tb through a second external conveyor apparatus 572 from a classifying transport unit 530. Therefore, according to the example of the configuration of FIG. 10, a system can be configured even for test trays 4Ta, 4Tb of different structures. As a result, it is possible to flexibly configure a system even for different forms of test apparatuses.

Above, according to the electronic device test apparatus 500 of the present embodiment, the time for transport work of electronic devices between the customer trays 4C and the test trays 4T can be shortened. In addition, it is possible to flexibly handle electronic devices in accordance with the operating state due to the processing capacity of a plurality of test unit 520, test specifications, maintenance, trouble, etc. This is particularly preferably used for a mass production line.

For example, as shown in FIG. 1, it is also possible to connect a tester T, test unit 520, loading transport unit 510, and classifying transport unit 530 by a communication network to acquire operating information of the apparatuses and select a test unit 520 to which the test tray 4T (electronic devices) can be assigned in accordance with the operating conditions of the apparatuses.

Further, in the above explanation, the specific example of a loading transport unit 510 transporting electronic devices from a customer tray 4C to a test tray 4T was explained, but the invention may be similarly realized by another transport device other than a customer tray 4C (for example, a test tray of a different structure, test tray of the same structure, another transport device). Similarly, in the above explanation, the specific example of a classifying transport unit 530 transporting electronic devices from a test tray 4T to a customer tray 4C was explained, but the invention may be similarly realized by another transport device used in the previous process other than a customer tray 4C (for example, a test tray of a different structure, test tray of the same structure, or another transport device). Further, the specific example of a classifying transport unit 530 classifying and transporting electronic devices to customer trays 4C based on classification information of the rests of testing the electronic devices was explained, but the system may also be configured using a nonclassifying transport unit transporting electronic devices from a test tray 4T to a customer tray 4C as they are without classification when there is no need for classification at this stage. Here, units meaning both a classifying transport unit 530 and nonclassifying transport unit will be referred to as an "unloading transport unit". If desired, the unloading transport unit may be made a transport unit of a mode unloading a test tray 4T to the outside as it is.

Figure 11:
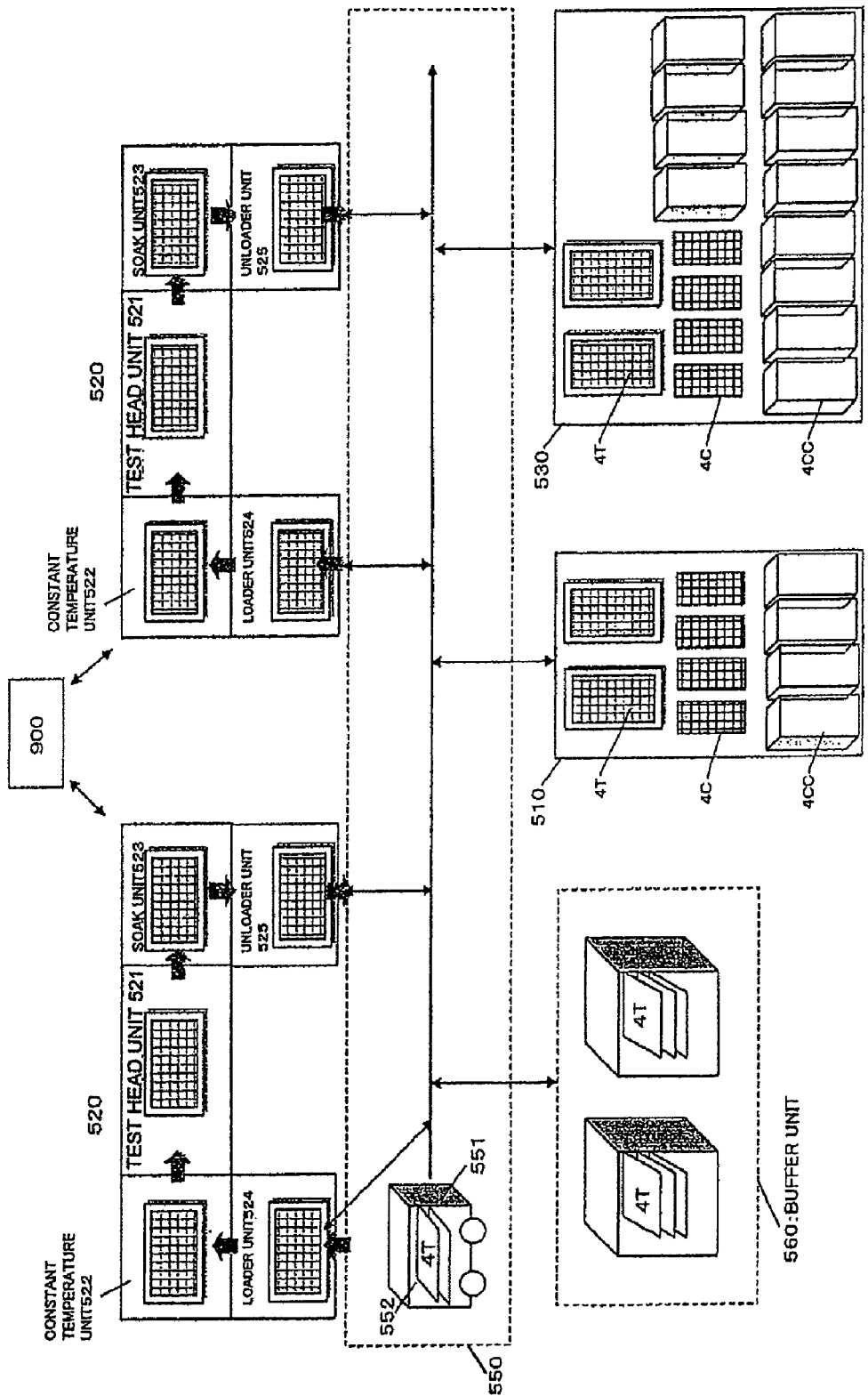
FIG. 11 is block diagram showing another embodiment of the electronic device test apparatus according to the present invention.

Next, FIG. 11 shows another example of the configuration of the test tray conveyor apparatus 550. The test tray conveyor apparatus 550 in this example of the configuration uses a self-propelled vehicle 551 (for example, a monorail type self-propelled vehicle, track type vehicle, trackless type vehicle (AGV)). One or more self-propelled vehicles 551 are provided and convey and transfer test trays with the test units 520, loading transport unit 510, classifying transport unit 530, and buffer unit 560. The self-propelled vehicle 551 suitably controls the conveyance based on the conveyance system management unit 900 controlling the conveyance of the system as a whole.

Here, the conveyance system management unit 900 is connected to various apparatuses by a network, transfers control signals relating to loading/unloading, and manages the self-propelled vehicle 551 overall. Further, the conveyance system management unit 900 preferably receives information of the results of judgment of electronic devices carried on all test trays 4T (quality judgment information or classification information (operating speed etc.)) and process-wise test progress information from the different devices and manages transport of all electronic devices.

The self-propelled vehicle 551 is provided with a tray magazine 552 for holding or storing at least one test tray 4T. The test trays 4T handled by the self-propelled vehicle 551 include test trays in the untested state, test trays finished being tested in the different processes ejected from the different processes, test trays in the state where the tests of all processes are finished, test trays judged to have failed/empty test trays, and other test trays.

The loader unit 524 of each test unit 520 is provided with a structure transferring test trays 4T with a self-propelled vehicle 551 and loads test trays from elsewhere and unloads emptied empty test trays. The unloader unit 525 of each test unit 520 is provided with a structure transferring test trays 4T with a self-propelled vehicle 551 and unloads tested test trays and receives empty test trays. Here, when a structure internally conveying empty test trays emptied at the loader unit 524 side is provided at the test unit 520, the empty test trays at the loader unit 524 side can also be received. Note that if desired, the loading transport unit 510 and classifying transport unit 530 may also be realized by an integral configuration. Note that when using electronic devices tested by this electronic device test apparatus in another system, if supply in the state of the test trays is possible, the system may be realized by a configuration deleting the classifying transport unit 530. Further, when supply from another system in the state of the test trays is possible, the system may be realized by a configuration deleting the loading transport unit 510.

The buffer unit 560 shown in FIG. 11 is provided with a structure for transferring test trays 4T with a self-propelled vehicle 551 and temporarily stores test trays in various states. For example, at the stage where loading of test trays at the next process test unit 520 is still unnecessary, the test trays unloaded from the previous process test unit 520 are temporarily stored at the buffer unit 560. At the stage when the next process test unit 520 can be loaded, it then loads the temporarily stored test trays.

According to this, even cases where the test units 520 differ in throughput can be flexibly handled. Further, the classifying transport unit 530 receives an empty test tray, temporarily stores it, then supplies it to the unloader unit 525 of the necessary stage test unit 520 or loading transport unit 510. Further, the buffer unit 560 may also be provided with a transport function for transporting electronic devices between a plurality of test trays. By providing this transport function, electronic devices judged to have failed in the previous process can be replaced with electronic devices judged to have passed on another test tray so as to rearrange electronic devices so the next process performs the maximum number of simultaneous measurements and improve the throughput. Further, by providing this transport function, it is possible to concentrate electronic devices judged to have failed in each process on an empty test tray, then load it into the classifying transport unit 530. Further, if desired, it is also possible to build in the function of this buffer unit 560 into one or both of the loading transport unit 510 and classifying transport unit 530. Further, if desired, the loading transport unit 510, the classifying transport unit 530, and the buffer unit 560 may be realized by an integral configuration.

Therefore, according to the example of the configuration of the FIG. 11, it is possible to configure a parallel operation system where a plurality of test units test electronic devices under the same test conditions. Further, it is possible to configure a serial operation system where a plurality of test units test electronic devices under different test conditions. Further, it is possible to reconfigure the system to further increase the number of test units for test conditions where electronic devices are kept waiting for loading and conversely possible to reconfigure the system to reduce the number of test units for test conditions where electronic devices are not kept waiting for loading and there is extra leeway in throughput. Further, depending on the type of the electronic devices, differences arise in the throughput of the test units with different test conditions, but according to this configuration, there is the advantage that the number of test units for the same test conditions can be dynamically changed to enable operation of the system as a whole with the best throughput conditions. Further, test units requiring repair or maintenance can be removed from the conveyance route temporarily, so the system as a whole need not be stopped and the operating rate can be improved. Further, the number of test units installed can be changed at any time, so test units can be added at any time. Further, the test units can be freely positioned with respect to each other, so it is also possible to flexibly configure the system in a range enabling operation of a self-propelled vehicle 551 without being bound by the physical limitative conditions of the installation floor.

Second Embodiment

FIG. 12 to FIG. 20 are views of a second embodiment of the electronic device test apparatus according to the present invention.

Figure 12:
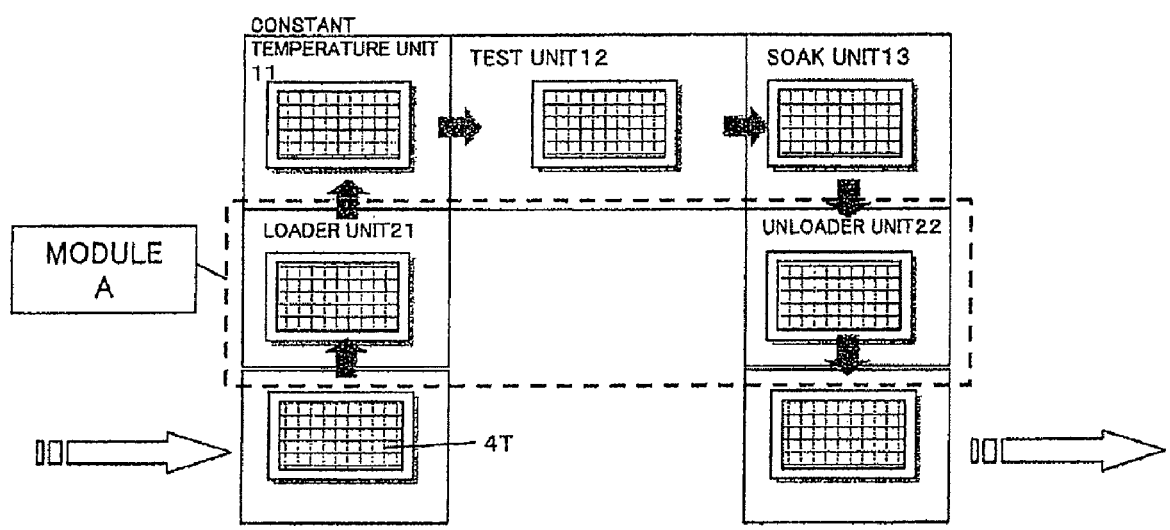
FIG. 12 is block diagram showing still another embodiment of the electronic device test apparatus according to the present invention.
Figure 13:
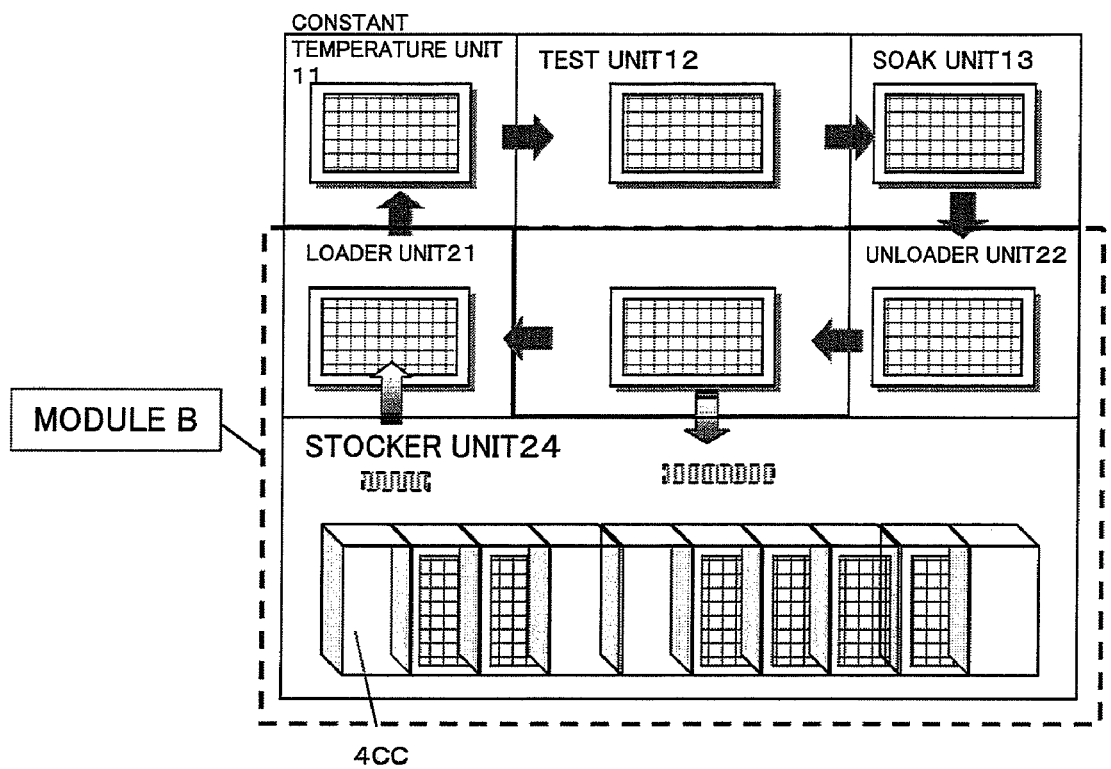
FIG. 13 is block diagram showing still another embodiment of the electronic device test apparatus according to the present invention.

In this embodiment, when interchangeably configuring a handling module A comprised of the loader unit 21 and unloader unit 22 as shown in FIG. 12 and a handling module B comprised of the loader unit 21, unloader unit 22, and stocker unit 24 as shown in FIG. 13 for the loader unit 21, unloader unit 22, and stocker unit 24 other than the test module 1 configured by the constant temperature unit 11, test unit 12, and soak unit 13 shown in FIG. 12 and FIG. 13 and using the test module 1 for the system of the electronic device test apparatus 500 according to the above-mentioned first embodiment, as shown in FIG. 12, the handling module A is used. Further, when using this as a single electronic device test apparatus, as shown in FIG. 13, the handling module B is used. Due to this, this can be used both for the mass production type test system shown in FIG. 1 and FIG. 2 and as a single electronic device test apparatus.

Note that a detailed example of the configuration of modularization of the electronic device test apparatus shown in FIG. 13 will be explained below with reference to FIG. 14 to FIG. 20.

Figure 18:
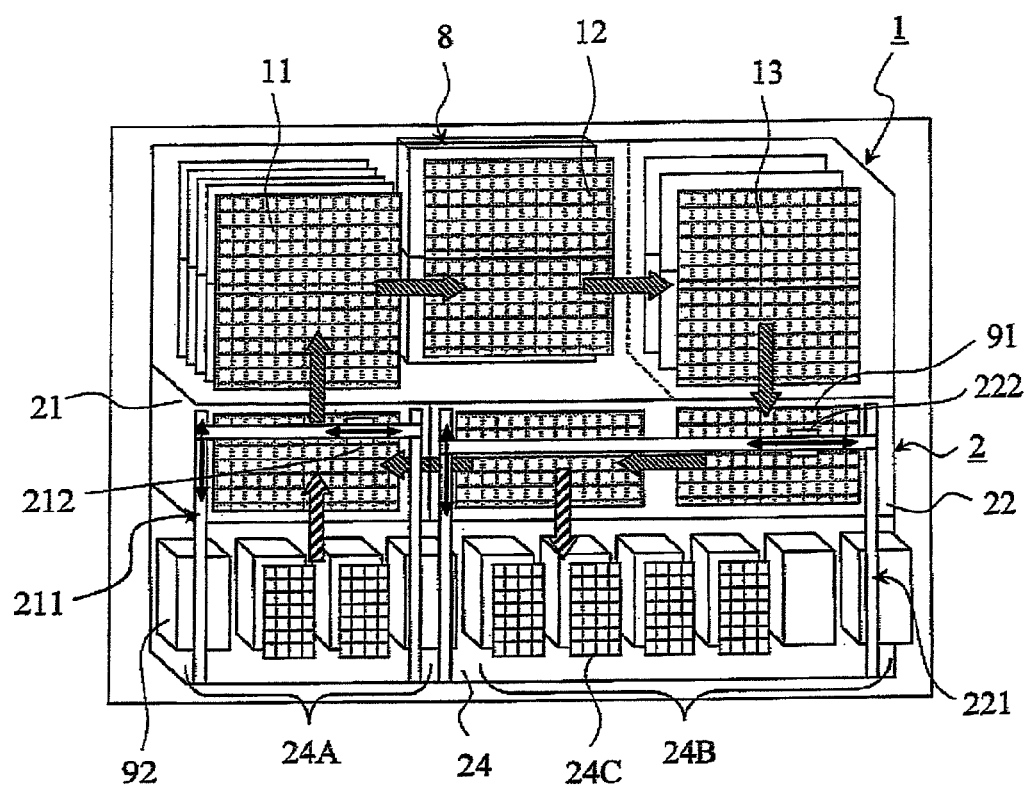
FIG. 18 is conceptual view of the method of transporting electronic devices and trays in an electronic device test apparatus according to the present invention.

The electronic device test apparatus according to the present embodiment tests electronic devices to determine whether the electronic devices suitably operate in a state given a desired high temperature or low temperature stress or not given temperature stress at ordinary temperature and classifies the electronic devices in accordance with the test results to good devices, defects, and different categories. It is comprised of a handler for successively transferring electronic devices to contact terminals provided at the test head, classifying the electronic devices finished being tested in accordance with the test results, and storing them at predetermined trays, a tester (not shown) for transmitting a predetermined test pattern and testing and evaluating the electronic devices based on the response signals, and a test head 3 having contact terminals and functioning as an interface between the handler and tester (FIG. 18). The tester and test head 3 and the handler and tester are electrically connected through cables and other signal lines etc. Note that the contact terminals include contact terminals for contacting the drive terminals of the electronic devices and contact terminals for contacting the input/output terminals of the electronic devices. These are referred to overall as "contact terminals". Further, the contact terminals input and output various signals from the tester through sockets and circuit boards provided at the test head.

Figure 14:
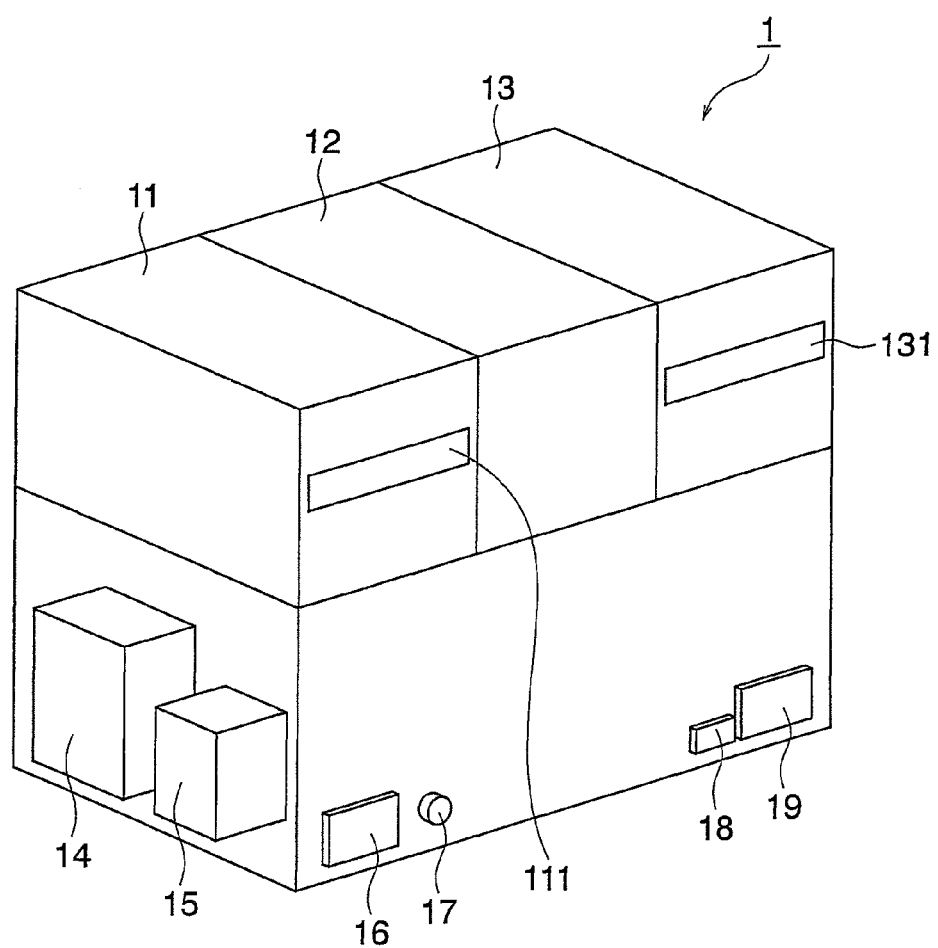
FIG. 14 is schematic view of an embodiment of a test module according to the present invention.
Figure 15:
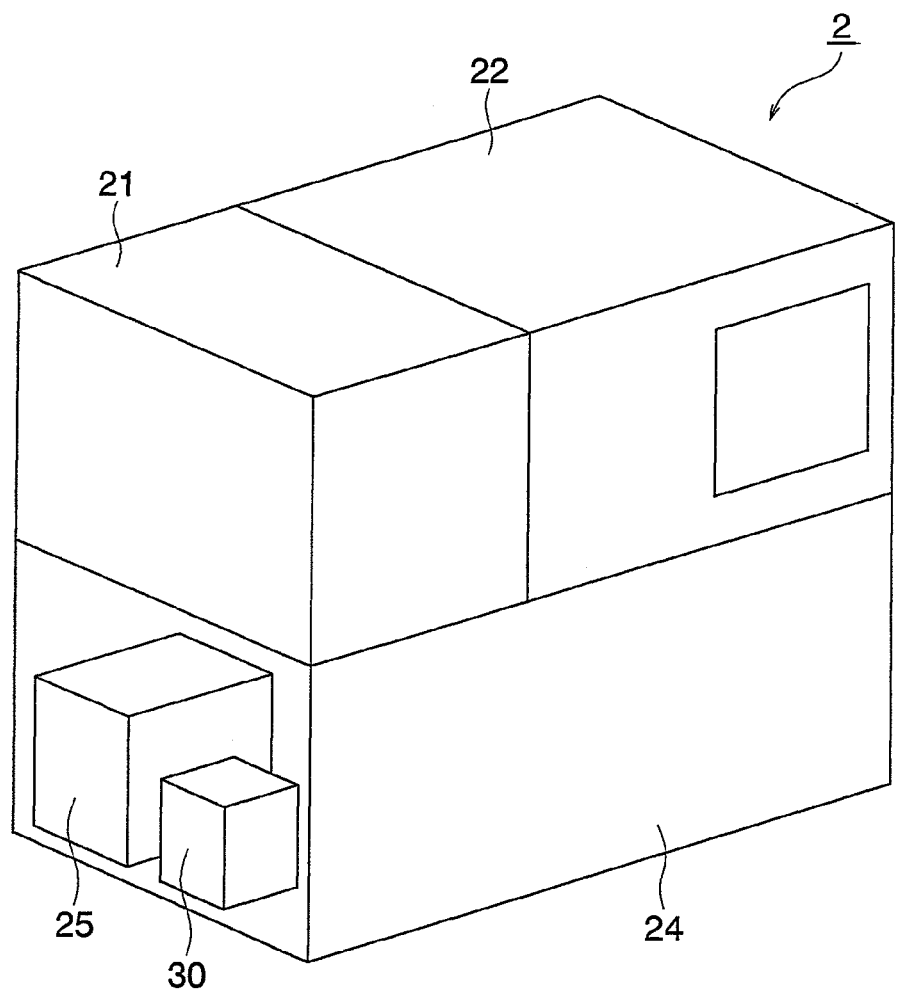
FIG. 15 is schematic view (front view) of the embodiment of a handling module according to the present invention.
Figure 16:
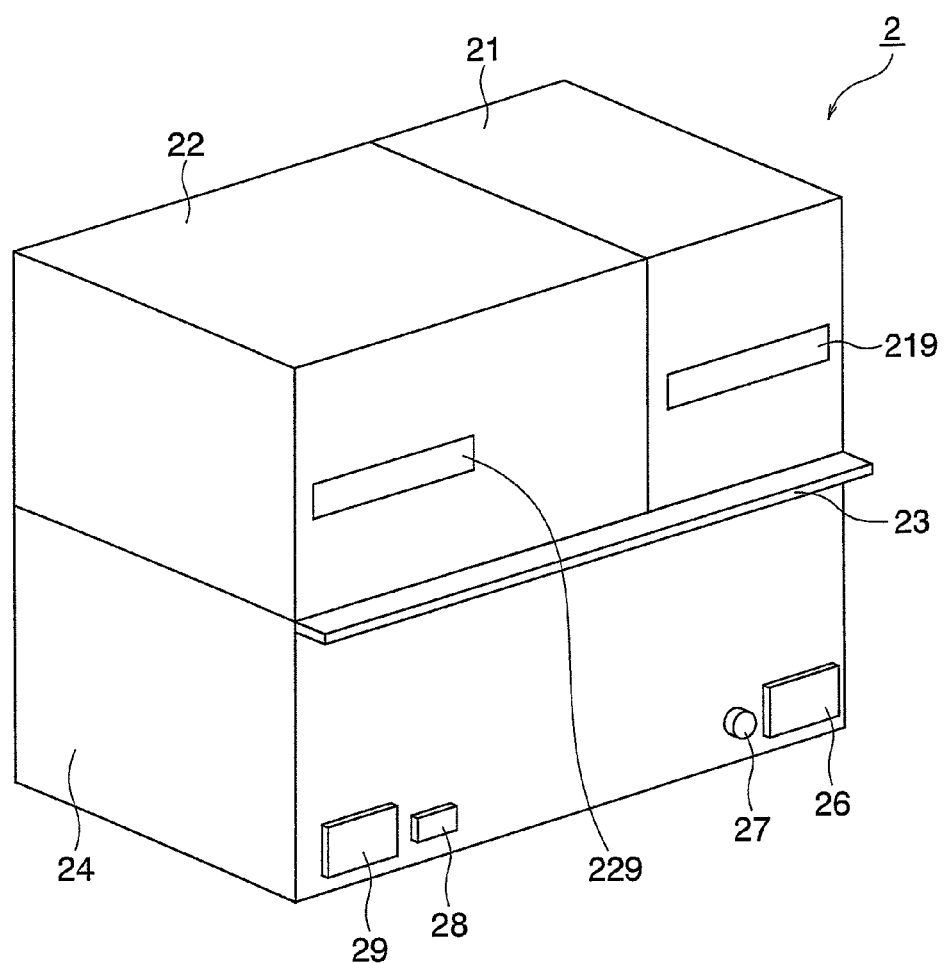
FIG. 16 is schematic view (back view) of the embodiment of a handling module according to the present invention.

In the present embodiment, this handler is comprised of the test module 1 shown in FIG. 14 and the handling module 2 shown in FIG. 15 and FIG. 16.

The test module 1 sets the electronic devices loaded from the handling module 2 to the target temperature and brings the electronic devices into electrical contact with the contact units of the test head from which the test pattern is output and to which the response pattern is input.

As shown in FIG. 14 and FIG. 18, the test module 1 of this example is comprised of a soak unit 11 for raising or lowering the electronic devices loaded from the handling module 2 to the target temperature, a test unit 12 for bringing the electronic devices into electrical contact with the contact units in the state maintained in temperature, and an eject unit (soak unit) 13 for temporarily holding the electronic devices finished being tested at the test unit 12. The units are formed to be able to be attached and detached to and from each other. That is, the frames forming the frameworks of the units 12□13□ and 14 forming the test module 1 are standardized. The units can be attached and detached to and from each other through the frames.

Further, the electronic devices are transported inside the test module 1 by a test tray 4T as shown in for example FIG. 18. The test tray 4T is designed to be circulated inside the test module 1 and handling module 2 by a not shown conveyor as shown by the arrows. Further, the later mentioned loader unit 21 moves electronic devices carried on a customer tray (C-tray) 4C to a test tray 4T and transports this test tray 4T from the soak unit 11→test unit 12→eject unit 13→unloader unit 22 for testing the electronic devices.

Figure 17:
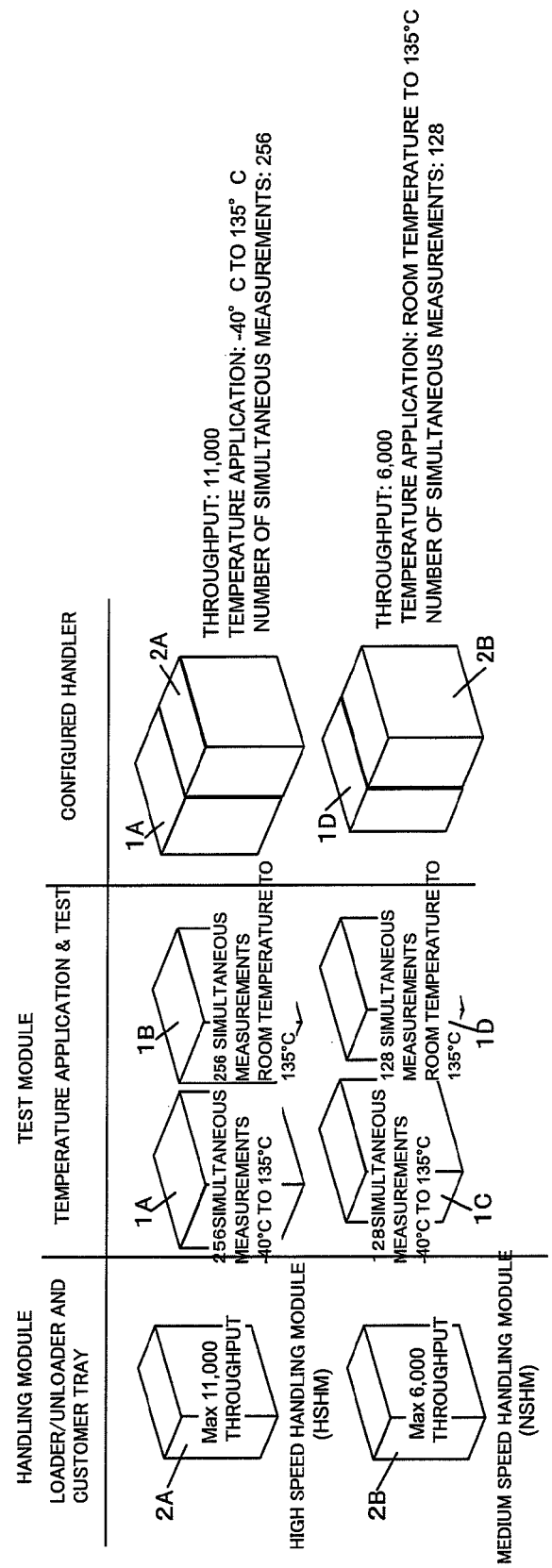
FIG. 17 is view for explaining the combination of types of handling modules and test modules according to the present invention.

The test module 1 of this example, as shown in FIG. 17, comes in four types including a type enabling 256 number of simultaneous measurements in the test unit 12 and a type enabling 126 and including a type enabling a test temperature of −40° C. to 135° C. in range and a type enabling a test temperature of room temperature to 135° C. in range. That is, as shown in the drawings, there are a type 1A enabling 256 simultaneous measurements and a test temperature of −40° C. to 135° C., a type 1B enabling 256 simultaneous measurements and a test temperature of room temperature to 135° C., a type 1C enabling 128 simultaneous measurements and a test temperature of −40° C. to 135° C., and a type 1D enabling 128 simultaneous measurements and a test temperature of room temperature to 135° C.

Figure 19:
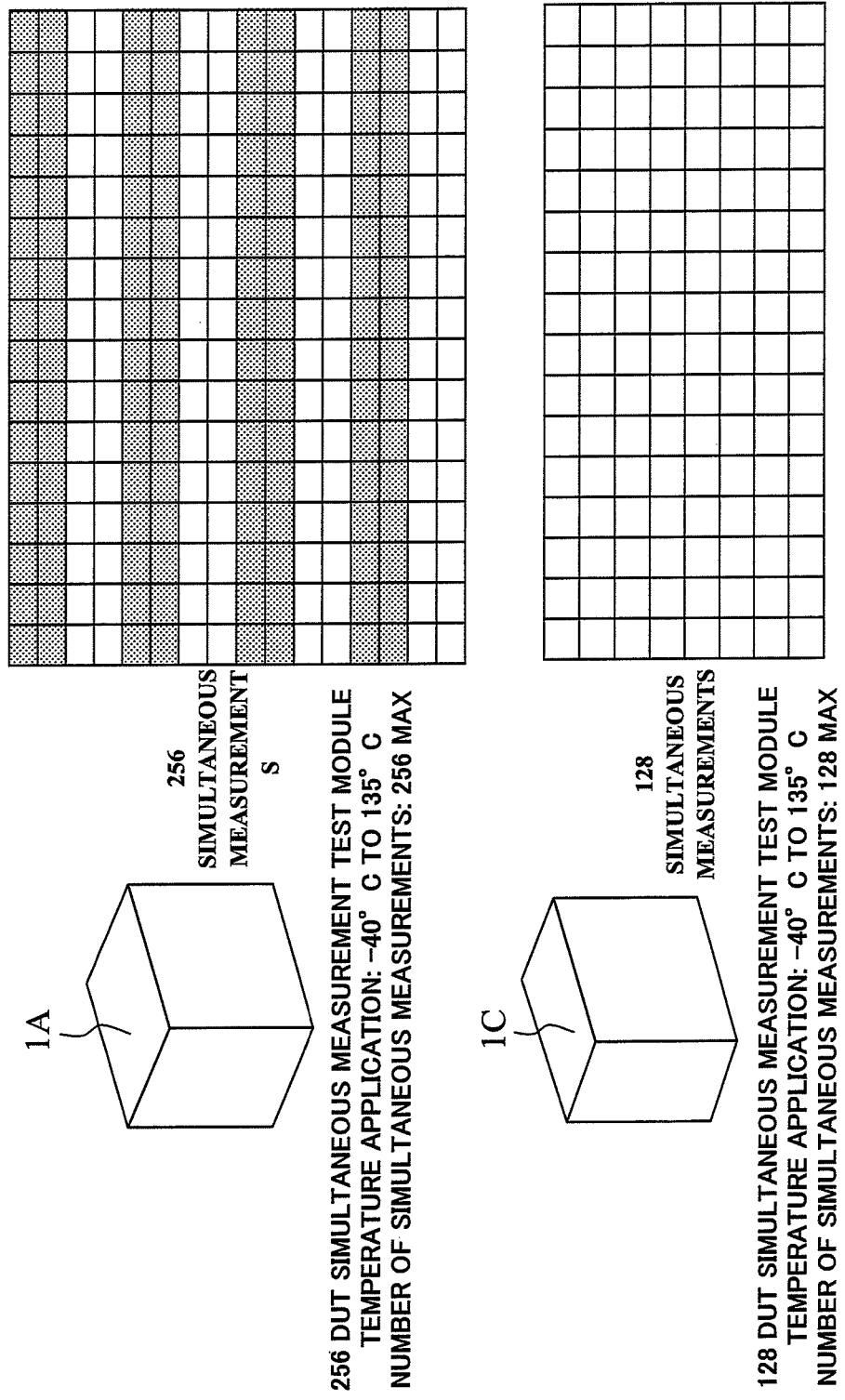
FIG. 19 is view for explaining the method of selection based on the number of simultaneous measurements of the test module according to the present invention.

The difference between the types enabling 256 and 128 simultaneous measurements is whether 256 or 128 pushers are provided for pushing the electronic devices to the contact units in the test unit 12. The frames forming the framework of the test units 12 are all formed the same (standard shapes). The layout shown at the top of FIG. 19 is an array of 256 pushers for simultaneous measurement, while the layout shown at the bottom of the figure is an array of 128 pushers for simultaneous measurement. Of course, there are also two types of specifications of the contact units of the test head: one for 256 sockets and one for 128 sockets.

The difference between the type enabling a range of test temperature of −40° C. to 135° C. and the type enabling one of room temperature to 135° C. is whether the electronic devices can be cooled to an extremely low temperature of −40° C. or so. In the former type, the soak unit 11 is provided with a cooling device enabling the electronic devices to be cooled to −40° C., while the eject unit 13 is provided with an anti-condensation device for preventing condensation at the electronic devices cooled to such a low temperature. Further, in addition to this cooling device and anti-condensation device, a heating device for heating the electronic devices to room temperature to 135° C. is provided. As opposed to this, in the latter type test module 1, only the heating device is provided for heating the electronic devices to room temperature to 135° C. The cooling device for cooling to an extremely low temperature forms the soak unit 11 by a chamber and passes nitrogen gas or another cooling gas through this chamber. Further, as the anti-condensation device, a device for heating the electronic devices maintained at a low temperature to near room temperature can be illustrated.

However, the frames forming the soak unit 11 and eject unit 13 are all the same shapes (standard shapes). Each type of unit can be attached to and detached from the adjoining units.

As shown in FIG. 14, the front side of the soak unit 11 (surface to which later explained handling module 2 is attached) is formed with an inlet opening 111 into which a test tray carrying a large number of electronic devices is loaded. Further, the front side of the eject unit 13 is formed with an outlet opening 131 for unloading a test tray finishing being tested at the test unit 12 and arriving at the eject unit 13 to the handling module 2. Further, these inlet openings 111 and outlet openings 131 are standardized in position and shape (size). All types of soak units 11 and eject units 13 have openings at the same position and of the same shape. Further, corresponding to the inlet opening 111, the loader unit 21 of the handling module 2, as shown in FIG. 11, is formed with an outlet opening 219 of the same position and shape. Similarly, the unloader unit 22 of the handling module 2, as shown in the same figure, is formed with an inlet opening 229 of the same position and shape. Further, when assembling the test module 1 and handling module 2, the inlet opening 111 of the soak unit 11 and the outlet opening 219 of the loader unit 21 are joined and the outlet opening 131 of the eject unit 13 and the inlet opening 229 of the unloader unit 22 are joined. Due to this, the test tray can be transferred between the units.

Note that as shown in FIG. 16, when assembling the test module 1 and handling module 2, it is desirable to provide a member 23 for mechanical positioning of the two at least at one of the modules 1 and 2.

Returning to FIG. 1, the bottom of the frame of the test module 1 is provided with a breaker unit 14 for the power source used at the test module 1, terminal power unit, and control unit 15. Further, at fixed positions at the front side of the test module 1 (surface attached to the handling module 2), a mechanical interface 16 for air pipes forming the circuit of the various fluid pressure cylinders etc., power connector 17, software interface 18 for transmitting and receiving ID data or temperature control data for identifying the modules or units, an electrical interface 19 for the electric motor, sensor, etc. are provided. Further, it is also possible to provide the components at each of the modules.

Here, for the software for controlling the operation of the modules, the ID data identifying the modules is read and software corresponding to the ID data is applied.

Further, it is desirable to prepare in advance software corresponding to possible combinations of modules. In this case, it becomes possible to immediately change and utilize the system configuration of the electronic device test apparatus to correspond to the electronic devices.

These mechanical interface 16, power connector 17, software interface 18, and electrical interface 19 are positioned and shaped to enable connection to the mechanical interface 26, power connector 27, software interface 28, and electrical interface 29 shown in FIG. 16 when assembling the test module 1 and handling module 2.

FIG. 15 and FIG. 16 show the handling module 2 according to the present embodiment. FIG. 15 is a front view in the case of assembly as a handler, while FIG. 16 is a back view mainly showing the surface for attachment with the above-mentioned test module 1. The handling module 2 stores the electronic devices before and after testing, takes out the stored electronic devices and unloads them to the test module 1, and classifies the electronic devices finished being tested at the test module 1 according to the test results.

As shown in FIGS. 15□16□ and 18, the handling module 2 of this example is comprised of a stocker unit 24 for storing electronic devices before and after testing, a loader unit 21 for taking out electronic devices stored in the stocker unit 24 and unloading them to the test module 1, and an unloader unit 22 for classifying the electronic devices finished being tested at the test module 1 according to the test results. The units 21□22□ and 24 are formed to be attachable/detachable. That is, the frames forming the units 21□22□ and 24 forming the handling module 2 are standardized. The units can be attached and detached through these frames.

Figure 20:
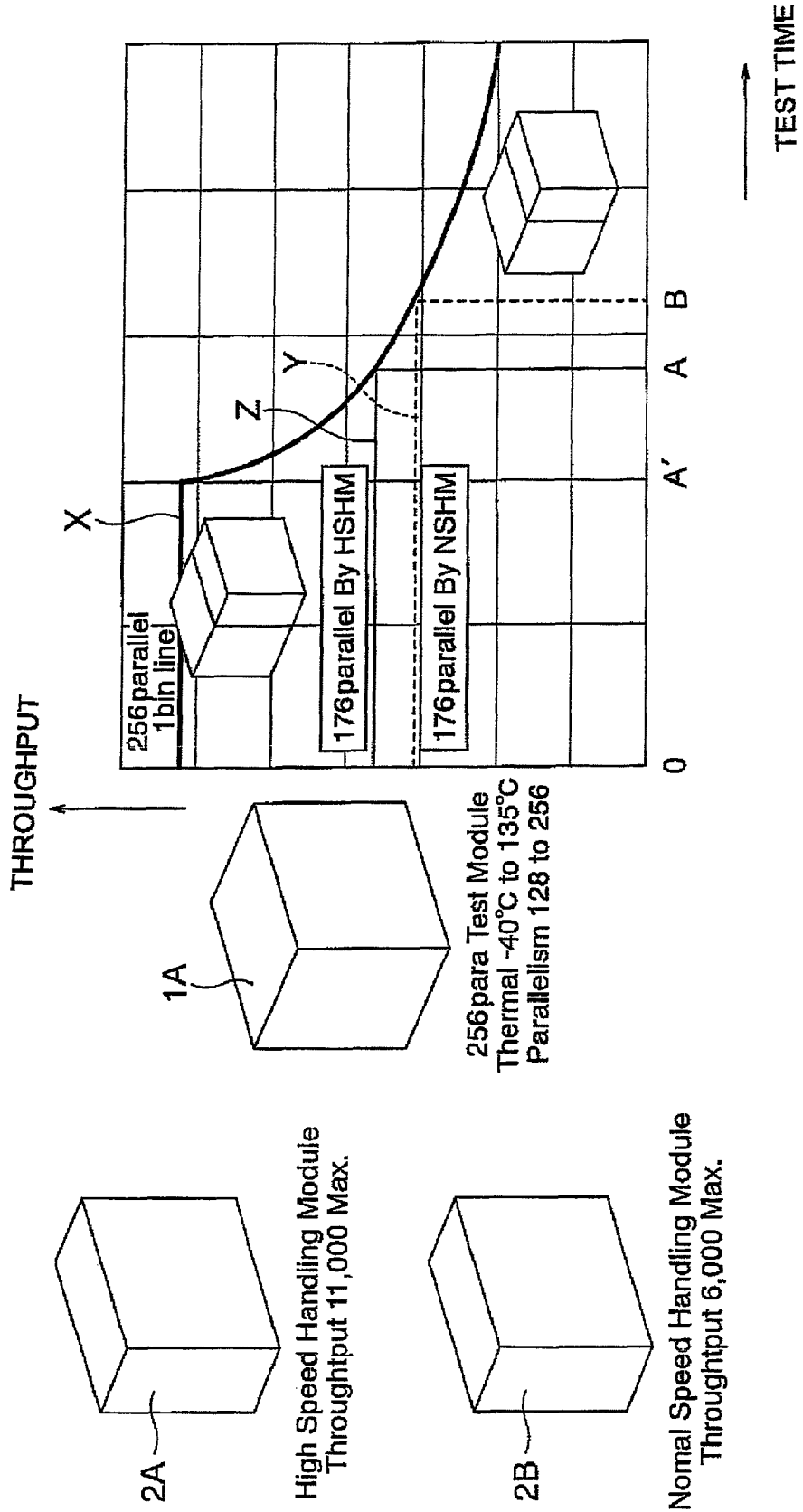
FIG. 20 is view for explaining the method of selection based on the throughput of the handling module and the number of simultaneous measurements of the test module according to the present invention.

The handling module 2 of this example, as shown in FIG. 20, comes in two types: a type 2A having a maximum throughput of 11000 devices/hour and a type 2B having a maximum throughput of 6000 devices/hour. These two types differ in the operating speed of the electronic devices XYZ conveyor apparatuses (so-called "pick and place" conveyor apparatuses) provided at the loader unit 21 and unloader unit 22 and the number of simultaneously holdable electronic devices. The type having a maximum throughput of a large 11000 devices/hour has faster operating speeds of the XYZ conveyor apparatuses and greater number of electronic devices able to be held at the same time. Along with the differences in the specifications, the equipment differ tremendously in cost.

The stocker unit 24, as shown in FIG. 18, has a stocker 24A for stacking and storing customer trays 4 carrying pluralities of pre-test electronic devices and a stocker 24B for stacking and storing customer trays 4C carrying pluralities of electronic devices finished being tested classified in accordance with the test results. Further, a tray conveyor apparatus 24C is used to successively unload customer trays 4C from the stocker 24a in which the pre-test electronic devices are stored to the loader unit 21. The electronic devices carried on each customer tray 4C are moved to a test tray 3 using the XYZ conveyor apparatus of the above-mentioned loader unit 21. For this reason, the stocker unit 24 and loader unit 21 are provided between them with an opening for transfer of customer trays 4C. Similarly, the XYZ conveyor apparatus is used to move electronic devices from the test tray 3 on which the tested electronic devices are carried to the customer trays 4 according to the test results. The customer trays 4C are conveyed to the stocker 24B of the stocker unit 24 using a tray conveyor apparatus 24C. For this reason, the stocker unit 24 and unloader unit 22 are provided between them with an opening for transfer of the customer trays 4C.

The stocker unit 24 sometimes has to be changed to a different stocker unit depending on the type or shape of the customer trays 4C. In this case, it may be changed to the corresponding stocker unit 24 in the present application. Therefore, the electronic device test apparatus is made more general in applicability.

Returning to FIG. 15, the bottom part of the frame of the handling module 2 is provided with a main power source 25 used for the handling module 2 and a control unit 30.

In the electronic device test apparatus according to the present embodiment configured in this way, the desired types of modules are selected and combined from the two types of handling modules 2 shown in FIG. 17 and four types of test modules 1. The handling modules 2 come in two types: type 2A having a maximum throughput of 11000 devices/hour and type 2B having a maximum throughput of 6000 devices/hour, so the specifications required for the line are selected. However, note that due to the test time of the electronic devices, sometimes the maximum throughput can be realized and sometimes it cannot.

Explaining this point, FIG. 20 is a graph plotting the throughput on the ordinate and the test time on the abscissa for the handler of this example. The "X" in the figure shows the throughput when using a handling module 2A having a maximum throughput of 11000 devices/hour.

That is, when the test time of the electronic devices is A' hours or less, a capacity of 11000 devices/hour is realized. If the test time exceeds A', the throughput falls. As opposed to this, the "Y" of the figure shows throughput when using a handling module 2B having a maximum throughput of 6000 devices/hour. When the test time is B or less, the maximum throughput of 6000 devices/hour is realized, but when the test time exceeds B, the throughput falls.

Here, when the test time on a semiconductor production line exceeds B, the throughput is the same whether using a handling module of the type 2A or using one of the type 2B, so from the viewpoint of the cost performance, it can be said to be suitable to employ the handling module 2B. Similarly, when the test time is A' or less, the handling module 2A realizes its maximum throughput, so from the viewpoint of productivity, it can be said to be suitable to employ the handling module 2A.

Further, when the test time is a time A between A' to B, as shown by "Z" in the figure, there is a difference in throughput. If this difference in throughput more than makes up for the difference in cost, it is suitable to employ the handling module 2A, but when it does not, employing the handling module 2B is suitable cost-wise. The handling modules 2A and 2B are selected from these viewpoints.

In this way, in this example, it is possible to combine modules with difference performances. Due to this, there is the great advantage that even if the test head connected to is changed or the type of electronic devices to be tested changes from the initially set system configuration, the optimum system configuration for the electronic devices can be changed to. Therefore, there is the great advantage that it is possible to flexibly and effectively utilize the electronic device test apparatus. Further, instead of developing and producing individual electronic device test apparatuses for new devices like in the past, it is sufficient to develop, produce, and utilize just the corresponding modules, so it is possible to realize an electronic device test apparatus aimed at shortening the time. Further, the system cost can also be reduced. Further, at temporary shutdowns for repair or maintenance of malfunctioning modules, it is also possible to temporarily change to replacement modules with the same or different performances so as to test the electronic devices, so the temporary shutdowns of the system can be greatly shortened and as a result the operating time can be substantially improved.

As opposed to this, the test module 1 comes in the four types 1A to 1D shown in the figure, so the specifications required for the line are selected considering the number of simultaneous measurements and the test temperature. For example, when requiring a very low temperature test of a test temperature of −40° C., the type 1A or 1C is selected.

FIG. 17 shows examples of combinations at the right end. The top row of the right end of the figure shows an electronic device test apparatus configured using a handling module 2A having a maximum throughput of 11000 devices/hour and a test module 1A having a number of simultaneous measurements of 256 devices and a test temperature of −40° C. to 135° C., while the bottom row of the same shows an electronic device test apparatus configured using a handling module 2B having a maximum throughput of 6000 devices/hour and a test module 1D having a number of simultaneous measurements of 128 devices and a test temperature of room temperature to 135° C.

The former test apparatus can handle a broad test range and is good in test efficiency, but has the defect that the cost rises by that amount, while the latter test apparatus features the opposite. Therefore, it is important to balance the performance and cost in accordance with the test specifications which the semiconductor production line requires, but the electronic device test apparatus of the present embodiment can be later reconfigured in the test module 1 and handling module 2 even after once being configured. At that time, several of the units forming the modules 1 and 2 can be changed.

In this way, in the electronic device test apparatus of the present embodiment, even if the maximum number of simultaneous measurements is changed due to the relationship between the maximum number of testable pins of the tester and the number of pins of the electronic devices, it is possible to optimize the electronic device test apparatus without allowing the efficiency of the test apparatus as a whole to decline due to the performance of the handler. As a result, even if the test specifications or test conditions change, it is sufficient to change only the minimum necessary extent of modules, so the design and development time and the production costs can be reduced.

Note that the embodiments explained above were described for facilitating understanding of the present invention and were not described for limiting the present invention. Therefore, the elements disclosed in the above embodiments include all design modifications and equivalents falling under the technical scope of the present invention.

For example, in the above-mentioned embodiments, the test module 1 and handling module 2 or, in the test module 1, the soak unit 11, test unit 12, and eject unit 13, or, in the handling module 2, the stocker unit 24, loader unit 21, and unloader unit 22, were configured to be able to be separated and connected and to be configured together, but in each unit, for example, the suction heads of the XYZ conveyor apparatus and the pushers for the contact units etc. may be further modularized.

Further, in the above-mentioned embodiments, the transport medium which the loading transport unit 510 received from the previous process and the transport medium which the classifying transport unit 530 conveyed to the later process were explained with reference to the specific example of a test tray 4T as a conveyance medium, but if desired they may also be realized by another usable conveyance medium (magazine, wafer ring, etc.)

Further, the test tray 4T may also be provided with a storage medium for holding information on the electronic devices carried, information on the judgment of quality at each process, classification information, etc As the storage medium, there is, for example, a wireless IC tag able to transfer information wirelessly.

Further, the loading transport unit 510 and the classifying transport unit 530, if desired, can be configured as an integral structure loading/unloading transport unit. In this case, an empty tray emptied at the loading side can be supplied inside to the unloading side.

Further, if desired, the loader unit 524 and the loading transport unit 510 may be configured as an integral structure loading unit. In this case, the conveyance mechanism can be shared, so the system can be configured inexpensively. Similarly, the unloader unit 525 and the classifying transport unit 530 can also be configured as an integral structure unloading unit. In this case as well, the conveyance mechanism can be shared, so the system can be configured inexpensively.

Further, so long as the conveyance of the test trays 4T is not obstructed, the loader unit 524 and unloader unit 525 can, if desired, be configured as the integral structure loading/unloading unit. In this case, operation switching between unloading and loading enables the conveyance mechanism to be shared and the system to be inexpensively configured.

Further, the buffer unit 560, if desired, may also be provided built in the loading transport unit 510, classifying transport unit 530, or transport unit 540. In this case, it is also possible to buffer electronic devices at the loading route or buffer them at the unloading route in accordance with the throughput of the test units.

What is claimed is:

1. An electronic device test apparatus, comprising;
    a plurality of testers on which are mounted test heads connected to test outputters for outputting test signals to a plurality of electronic devices and for inspecting response signals from the plurality of electronic devices;
    a loading transporter provided at a frontmost stage of the plurality of the testers that transports the plurality of electronic devices from a previous process conveyance medium to a test tray before loading the plurality of electronic devices into the plurality of testers;
    an unloading transporter provided at a rearmost stage of the plurality of testers that unloads the plurality of electronic devices from the test tray to a later process conveyance medium corresponding to the response signals of the plurality of electronic devices; and
    a transporter provided between the plurality of testers that transports the test tray from a previous process tester to a later process tester and includes a buffer that holds a plurality of the test trays to absorb a waiting time due to a difference in processing capacities between the plurality of test trays.

2. The electronic device test apparatus as set forth in claim 1, wherein the loading transporter and the unloading transporter are configured as a single loading-unloading transporter having the functions of the loading transporter and the unloading transporter, and including a loader-unloader, and
    the loader-unloader of the loading-unloading transporter selectively switches between:
    transporting the plurality of electronic devices from the previous process conveyance medium to a test tray before being loaded into one of the plurality of testers, and
    transporting the plurality of electronic devices from a test tray to the later process conveyance medium.

3. The electronic device test apparatus as set forth in claim 1, wherein the number of electronic devices carried on the test tray is a number of electronic devices processed at one of the plurality of testers having a minimum processing capacity among the plurality of testers.

4. The electronic device test apparatus as set forth in claim 1, wherein a tester with a high simultaneous measurement ability runs tests using a plurality of test trays.

5. The electronic device test apparatus as set forth in claim 4, wherein the tester with the high simultaneous measurement ability runs tests transporting the plurality of test trays in parallel.

6. The electronic device test apparatus as set forth in claim 1, wherein other electronic devices transported on the test tray are removed from the test tray at a test process at one of the testers.

7. The electronic device test apparatus as set forth in claim 6, further comprising an intermediate conveyor that carries the other electronic devices removed from the test tray.

8. The electronic device test apparatus as set forth in claim 6, further comprising an intermediate conveyor that transports electronic devices taken out from the test tray to another test tray.

9. The electronic device test apparatus as set forth in claim 1, wherein each tester includes a constant temperature applier that applies a thermal stress to the plurality of electronic devices and a soaker that removes the thermal stress applied to the plurality of electronic devices.

10. The electronic device test apparatus as set forth in claim 1, further comprising a controller that monitors operating states of the plurality of testers, the loading transporter, the unloading transporter and the transporter and selects one of the plurality of testers to which an electronic device of the plurality of electronic devices is assigned based on a monitoring result.

11. The electronic device test apparatus as set forth in claim 1, further comprising a controller that monitors operating states of the plurality of testers, the loading transporter, the unloading transporter and the transporter and changes a number of the plurality of testers assigned to each test process based on a monitoring result.

12. The electronic device test apparatus as set forth in claim 1, further comprising a controller that monitors operating states of the plurality of testers, the loading transporter, the unloading transporter and the transporter and changes a ratio of a number of the testers assigned to the loading transporter and the unloading transporter based on a monitoring result.

13. The electronic device test apparatus as set forth in claim 1, further comprising a handling module and a test module, wherein
    the handling module has functions of the loading transporter and the unloading transporter,
    the test module includes the plurality of testers, and
    the handling module and the test module are selectively separable and connectable.

14. The electronic device test apparatus as set forth in claim 13, wherein the handling module includes a stocker that stores a plurality of the test trays.

15. The electronic device test apparatus as set forth in claim 1, wherein the test tray has a storage medium and holds information on the plurality of electronic devices carried and information required at different processes.

16. The electronic device test apparatus as set forth in claim 1, wherein the test tray is successively conveyed from the frontmost stage of the plurality of testers to the rearmost stage of the plurality of testers in a state carrying the plurality of electronic devices and is returned from a rearmost stage tester to a frontmost stage tester.

* * * * *